US007675024B2

(12) United States Patent
Lenchenkov

(10) Patent No.: US 7,675,024 B2
(45) Date of Patent: Mar. 9, 2010

(54) METHOD AND APPARATUS PROVIDING COLOR FILTER ARRAY WITH NON-UNIFORM COLOR FILTER SIZES

(75) Inventor: Victor Lenchenkov, Boise, ID (US)

(73) Assignee: Aptina Imaging Corporation, Grand Cayman (KY)

( * ) Notice: Subject to any disclaimer, the term of this patent is extended or adjusted under 35 U.S.C. 154(b) by 0 days.

(21) Appl. No.: 12/081,922

(22) Filed: Apr. 23, 2008

(65) Prior Publication Data

US 2009/0266978 A1 Oct. 29, 2009

(51) Int. Cl.
*G01J 3/50* (2006.01)
*H01J 5/16* (2006.01)
*H04N 5/335* (2006.01)

(52) U.S. Cl. ...................................... 250/226; 348/274

(58) Field of Classification Search ............. 250/208.1, 250/226; 348/273, 274; 430/7
See application file for complete search history.

(56) References Cited

U.S. PATENT DOCUMENTS

| | | | | |
|---|---|---|---|---|
| 4,876,167 | A * | 10/1989 | Snow et al. | 430/7 |
| 5,929,432 | A * | 7/1999 | Yamakawa | 250/208.1 |
| 6,274,917 | B1 | 8/2001 | Fan et al. | |
| 6,417,892 | B1 | 7/2002 | Sharp et al. | |
| 6,864,557 | B2 | 3/2005 | Turner et al. | |
| 6,933,168 | B2 | 8/2005 | Bawolek et al. | |
| 7,170,046 | B2 * | 1/2007 | Higashitsutsumi | 250/226 |
| 7,196,391 | B2 | 3/2007 | Hsieh | |
| 7,199,348 | B2 | 4/2007 | Olsen et al. | |
| 7,202,543 | B2 | 4/2007 | Cole | |
| 7,247,394 | B2 | 7/2007 | Hatwar et al. | |
| 7,248,297 | B2 | 7/2007 | Catrysse et al. | |
| 2003/0160924 | A1 * | 8/2003 | Kashima | 349/115 |
| 2004/0070039 | A1 * | 4/2004 | Sekine et al. | 257/428 |
| 2008/0252829 | A1 * | 10/2008 | Chae et al. | 349/106 |

FOREIGN PATENT DOCUMENTS

| | | | |
|---|---|---|---|
| JP | 11150252 | A * | 6/1999 |
| WO | WO 2007/024580 | A2 | 3/2007 |

* cited by examiner

*Primary Examiner*—Thanh X Luu
(74) *Attorney, Agent, or Firm*—Dickstein Shapiro LLP

(57) ABSTRACT

Color filter arrays, methods of assembling color filter arrays, and systems containing color filter arrays. Color filter arrays are formed such that light entering through certain regions of the color filter array passes through multiple color filters to help prevent optical crosstalk and allow for tuning spectral responses.

43 Claims, 26 Drawing Sheets

A
A
B
B
C
C
A-A
B-B
C-C
10
12
14
16
54

56
A–A
B–B
24, 14
20, 10
16
22, 12

A
A
22
12
17
20
10

B
B
24
14
18
20
10

A
A
20
10
22
12
17

B
B
24
14
20
18

C
C
24
22
10
C–C
10

59
22, 12
A–A
24, 14
16
B–B
20, 10

60
24, 14
22, 12
20, 10
16
A–A
B–B
C–C
A
B
C
10
12
14
17
18
20
22
24

FIG. 5D
FIG. 5E
FIG. 5F
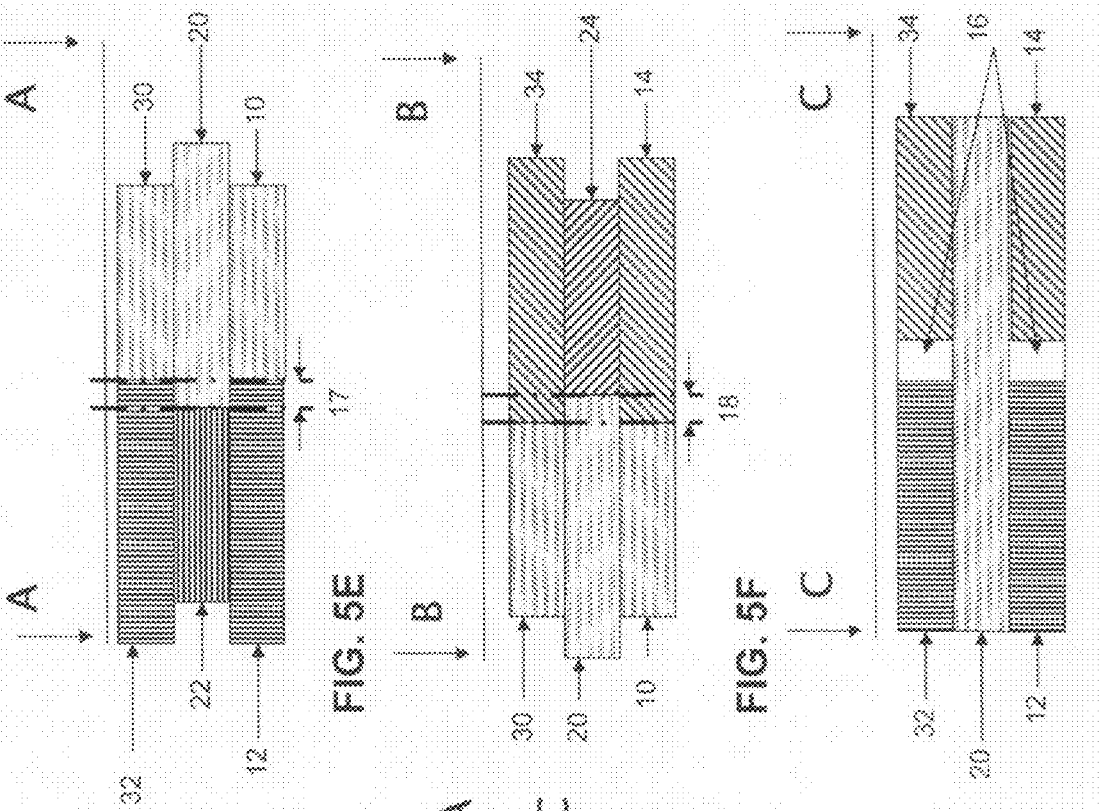
FIG. 5C
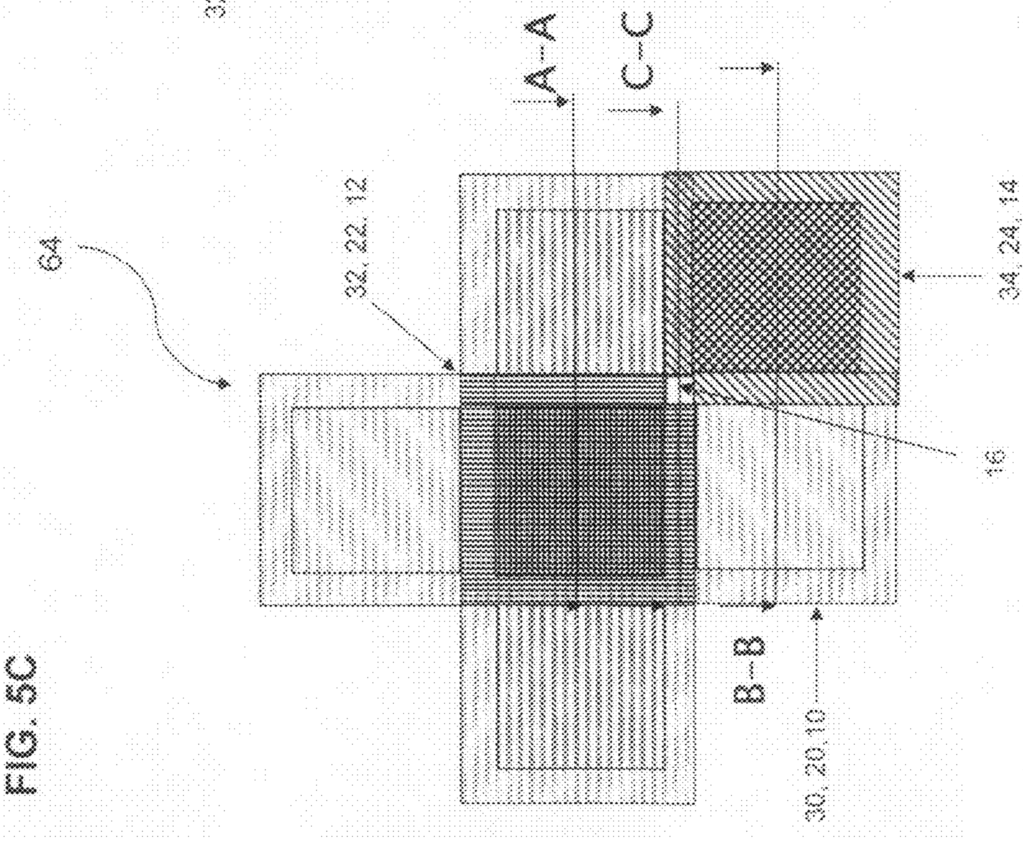

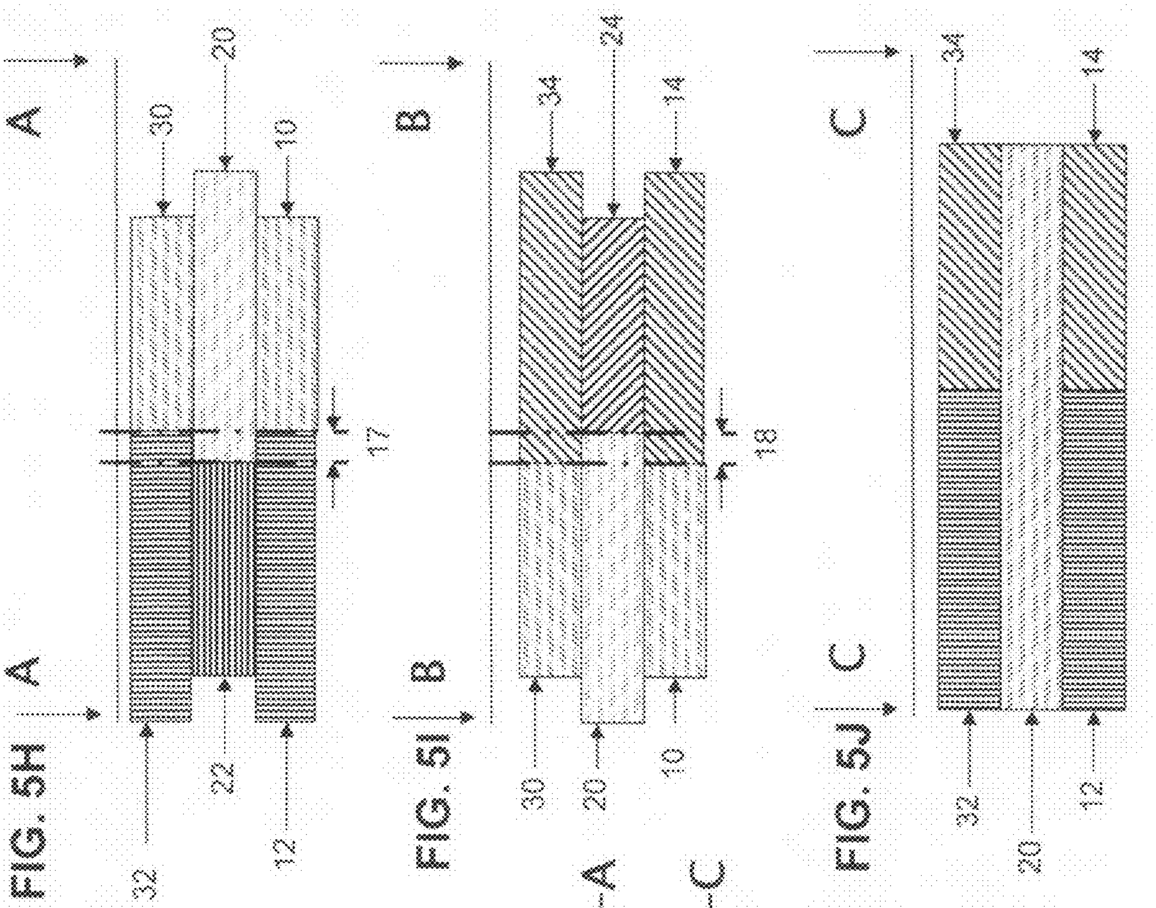
FIG. 5H
FIG. 5I
FIG. 5J
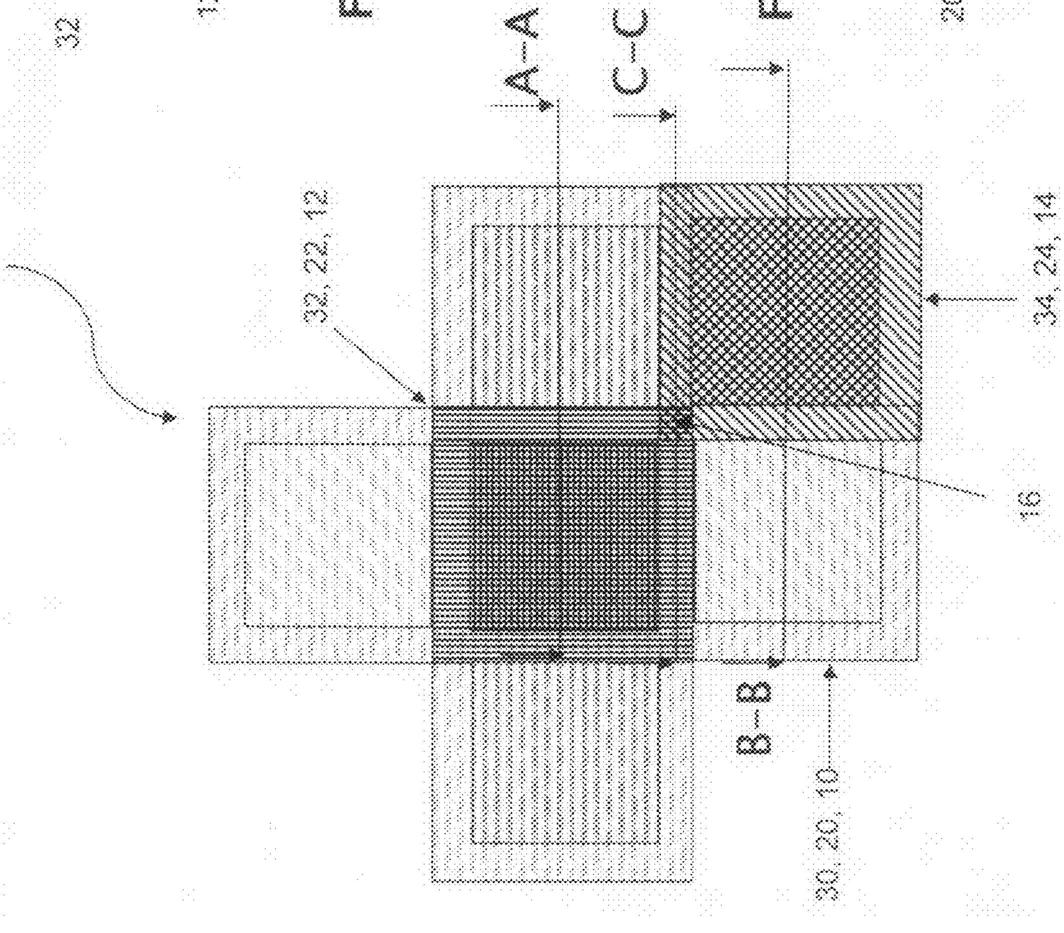
FIG. 5G

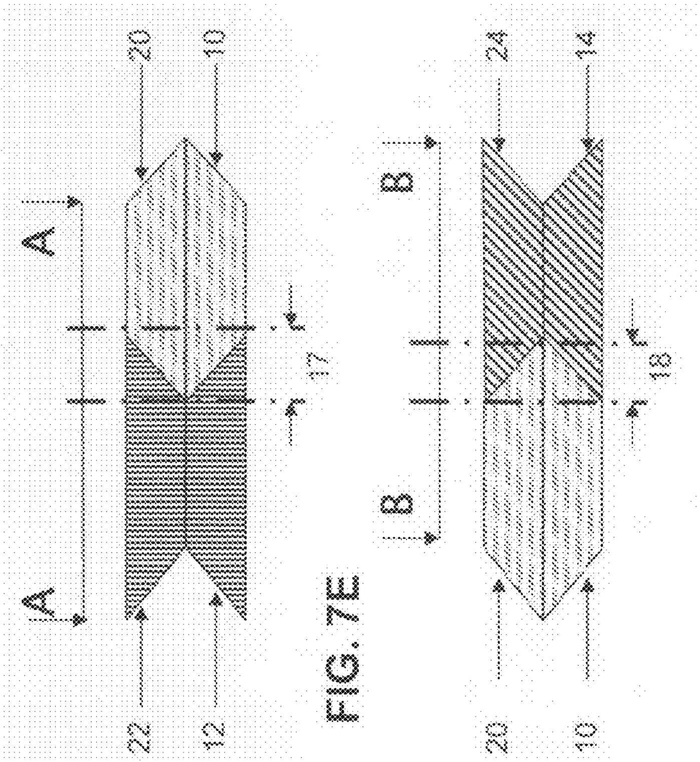
FIG. 7D
FIG. 7E
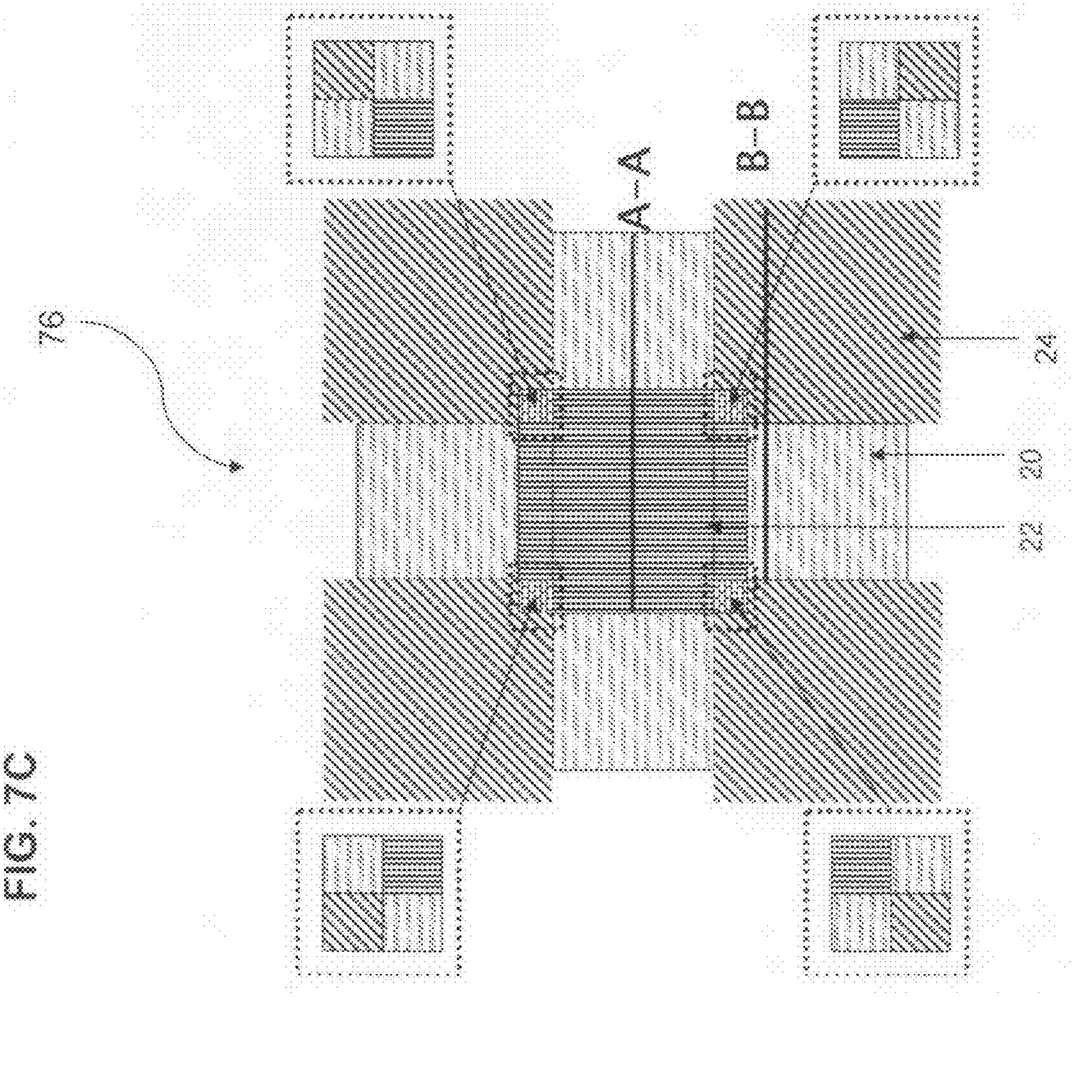
FIG. 7C

METHOD AND APPARATUS PROVIDING COLOR FILTER ARRAY WITH NON-UNIFORM COLOR FILTER SIZES

FIELD OF THE INVENTION

The embodiments described herein relate generally to the field of digital imaging, and more specifically to methods and apparatus providing color filter arrays for an imager.

BACKGROUND OF THE INVENTION

Microelectronic imagers are used in digital cameras, wireless devices with picture capabilities, and many other applications. Cellular telephones, Personal Digital Assistants (PDAs), computers, and stand alone cameras, for example, are incorporating microelectronic imagers for capturing and sending pictures. The growth rate of microelectronic imagers has been steadily increasing as they become smaller and produce better images with higher resolution.

Microelectronic imagers include image sensors that use Charged Coupled Device (CCD) systems, Complementary Metal-Oxide Semiconductor (CMOS) systems or other imager technology. CCD image sensors have been widely used in digital cameras and other applications. CMOS image sensors are quickly becoming very popular because they have low production costs, high yields, and small sizes.

One problem which occurs as image sensor pixel sizes decrease is an increase in optical crosstalk. Optical crosstalk occurs when light intended for a particular photodetector misses that photodetector and strikes a neighboring photodetector, thereby contaminating the adjacent pixel's charge packet with light intended for another pixel. Sensors often cover photodetectors with a color filter array, e.g., a Bayer filter pattern array, having filter elements so that colored light may be sensed by the photodetectors. While optical crosstalk may be caused by numerous factors, two contributors to optical crosstalk are particularly important with respect to embodiments disclosed herein. These include the deflected photon, and the errant photon.

The first contributor to optical crosstalk, the deflected photon, occurs when a photon intersects the intended filter element at an angle and winds up striking a conductor in a metallization layer. The photon, after striking the metallization layer, is deflected to an unintended photodetector. Thus, instead of going through the intended filter element and entering the intended photodetector, the photon, due to metallization layer deflection, enters an adjacent pixel's photodetector. Failure of a photon to enter the intended photodetector results in the adjacent pixel's charge packet being contaminated.

The second contributor to optical crosstalk, the errant photon, occurs when a photon is off course without even being deflected by a metallization layer. In these cases, a photon intersects the intended filter element at a substantial enough angle to cause the photon to go through a color filter which is not associated with the photodetector the photon will eventually impact. These photons are not deflected by a metallization layer, yet still enter an unintended photodetector and contaminate that pixel's charge packet.

BRIEF DESCRIPTIONS OF THE DRAWINGS

FIG. 5C is a top down view of a triple layer modified Bayer pattern color filter array with the red and blue portions of the pattern occupying the majority areas of the top and bottom layers, and neither red nor blue portions occupying the intersect positions of the top and bottom layers.

FIG. 5D is a cross-sectional view, along line A-A of FIG. 5C.

FIG. 5E is a cross-sectional view, along line B-B of FIG. 5C.

FIG. 5F is a cross-sectional view, along line C-C of FIG. 5C.

FIG. 5G is a top down view of a triple layer modified Bayer pattern color filter array with the red and blue portions of the pattern occupying the majority areas of the top and bottom layers, and the blue portions occupying the intersect positions of the top and bottom layers.

FIG. 5H is a cross-sectional view, along line A-A of FIG. 5G.

FIG. 5I is a cross-sectional view, along line B-B of FIG. 5G.

FIG. 5J is a cross-sectional view, along line C-C of FIG. 5G.

FIG. 7C is a top down view of a dual layer modified Bayer pattern color filter array with angled sidewalls with the red and blue portions of the pattern occupying the majority areas of the top layer, and the blue portion occupying the center position.

FIG. 7D is a cross-sectional view, along line A-A of FIG. 7C.

FIG. 7E is a cross-sectional view, along line B-B of FIG. 7C.

DETAILED DESCRIPTION OF THE INVENTION

Figure 1:
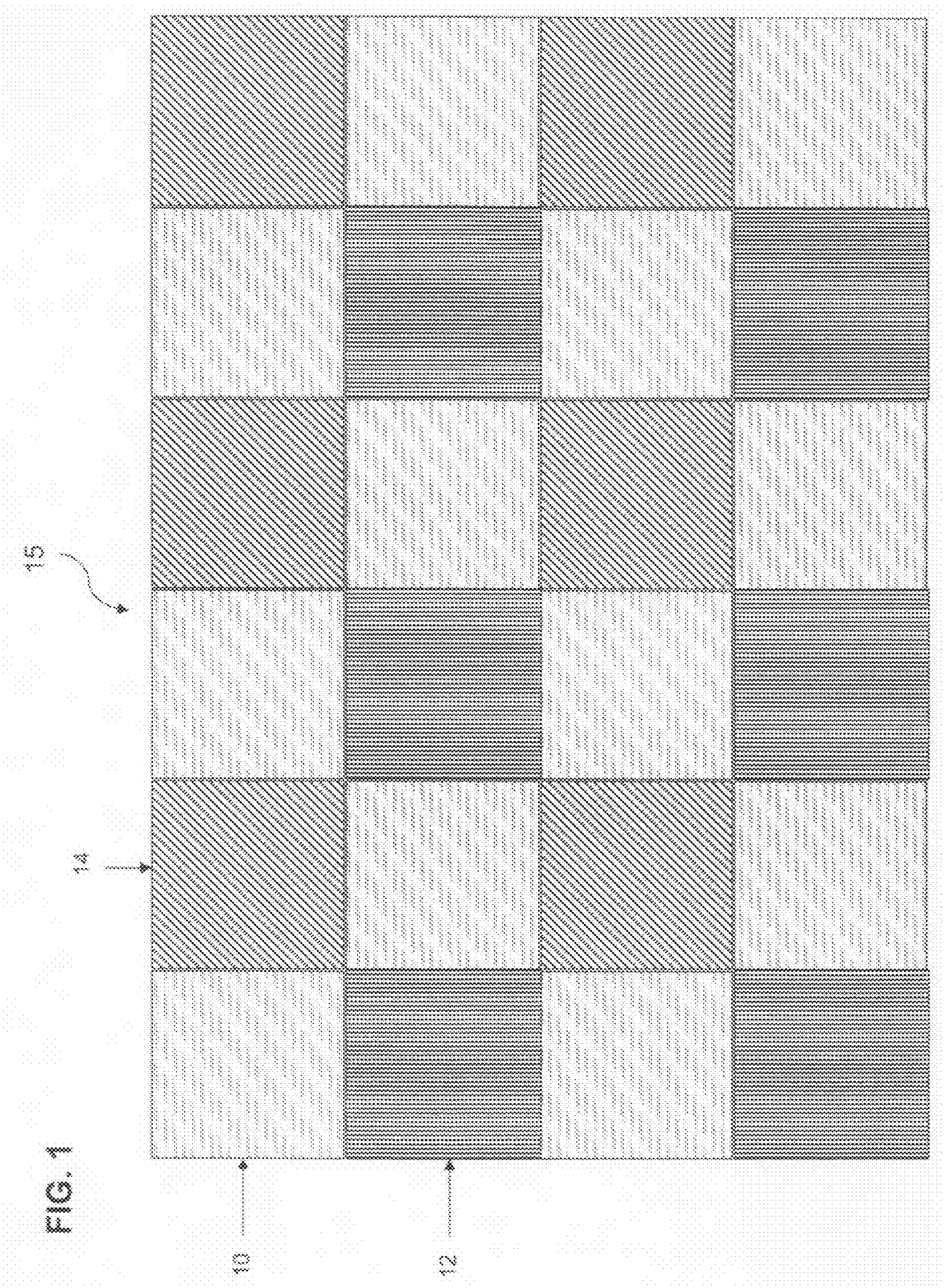
FIG. 1 is a top down view of a conventional Bayer-patterned color filter array.

In the following detailed description, reference is made to the accompanying drawings which form a part hereof, and in which is shown by way of illustration specific embodiments that may be practiced. It should be understood that like reference numerals represent like elements throughout the drawings. Specifically, green color filters, blue color filters, and red color filters use reference numerals 10, 12, and 14 respectively when the color filters are being represented in a single level; in embodiments using two levels of color filters the reference numerals 20, 22, and 24 are used respectively for the additional level to represent green, blue, and red color filters; in embodiments with three levels of color filter, the reference numbers 30, 32, and 34 are used respectively to represent green, blue, and red color filters.

The example embodiments described herein are described in sufficient detail to enable those skilled in the art to practice the invention. It is to be understood that other embodiments may be employed, and that structural, logical, and electrical changes may be made to the disclosed embodiments without departing from the invention.

FIG. 1 is a top down view of a Bayer-patterned color filter array 15 which is conventionally provided over an array of pixels in an imager. In a Bayer-patterned color filter array 15 the uniform green squares 10 occupy twice as much surface area of the array 15 as either the blue uniform squares 12, or the red uniform squares 14. In a Bayer-patterned color filter array 15 the surface area of twenty green color filters 10 will equal the surface area of ten blue color filters 12 plus ten red color filters 14. In short, a Bayer pattern is comprised of one-half green uniform squares 10, one-quarter red uniform squares 14, and one-quarter blue uniform squares 12. Viewed from any cross section that is cut parallel with any of the sides of any of the squares across a pixel row, there are either green squares 10 alternating with red squares 14, or green squares 10 alternating with blue squares 12. This arrangement can result in improperly filtered photons impacting an unintended photodetector.

Figure 1A:
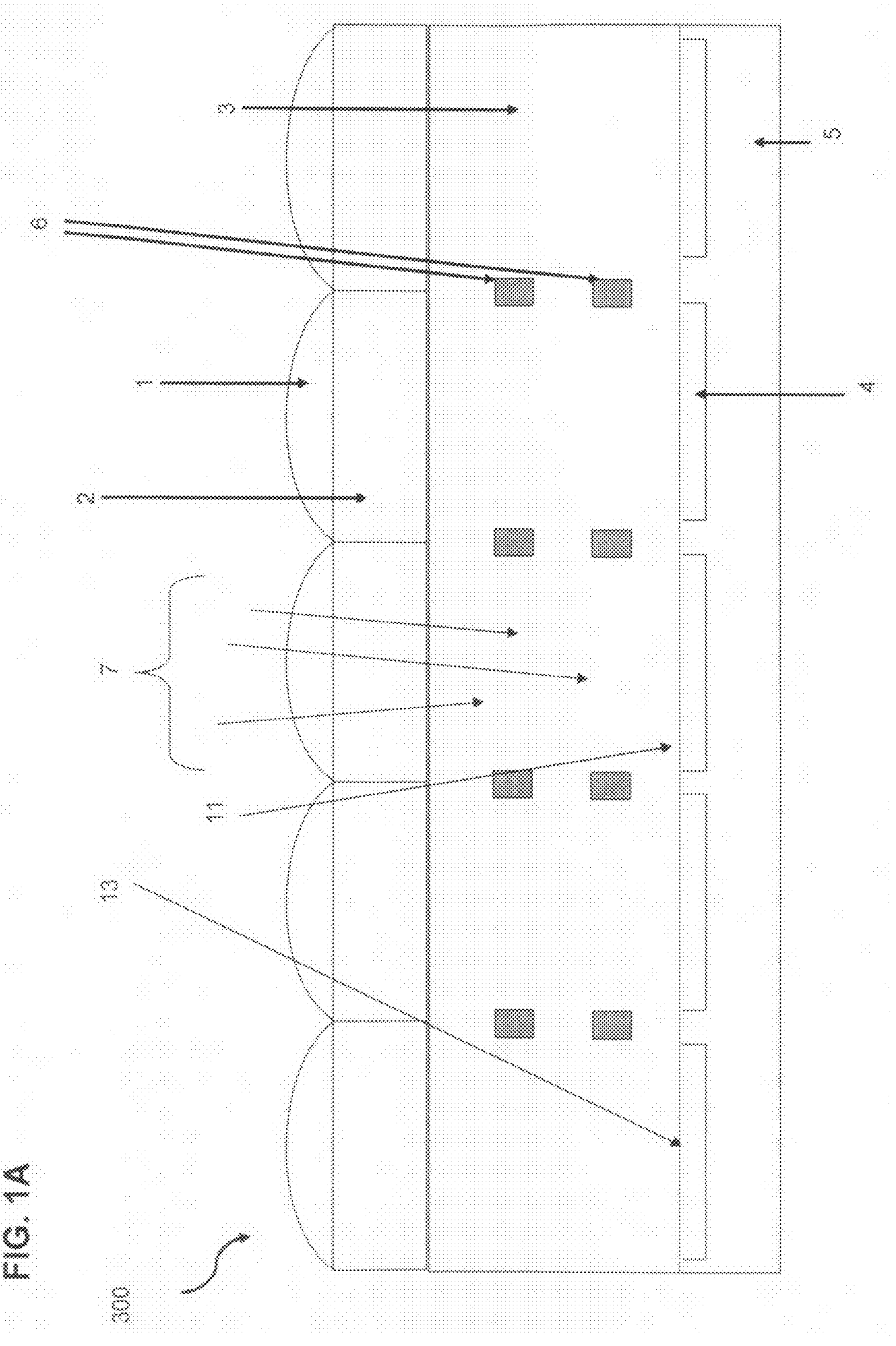
FIG. 1A is a cross-sectional expanded view of an imager pixel array displaying metallization layers.

FIG. 1A is a cross sectional view of an imager pixel array 300 with a conventional Bayer-patterned color filter array 15 (FIG. 1). Each imager pixel of the imager pixel array 300 is made up of a microlens 1, a color filter 2, a dielectric layer stack 3 which includes metallization connection layers 6, a photodetector which may be a photodiode 4, and a substrate 5. Also shown in FIG. 1A are photons 7 which pass through the appropriate color filter 2 and hit the photodetector immediately below the color filter 2. In some cases, however, the photons 7 do not follow an appropriate path. Specifically, in a first situation, the deflected photon 11 passes through a color filter 2, and is then deflected by a metallization connection layer 6 and strikes a photodetector of an adjacent pixel of the imager pixel array 300. In a second situation, the errant photon 13 is substantially off course, causing it to pass through a color filter 2 at an angle sufficient to cause the errant photon 13 to go through a color filter layer 2 not associated with the photodetector the errant photon 13 will eventually impact.

Figure 1C:
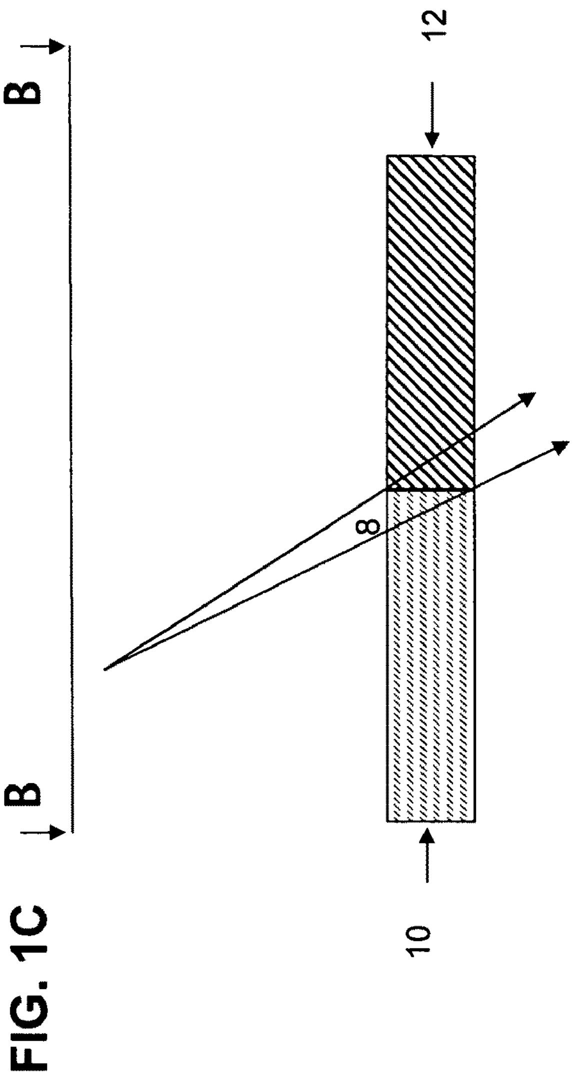
FIG. 1C is a cross-sectional view, along line B-B of FIG. 1B.
Figure 1B:
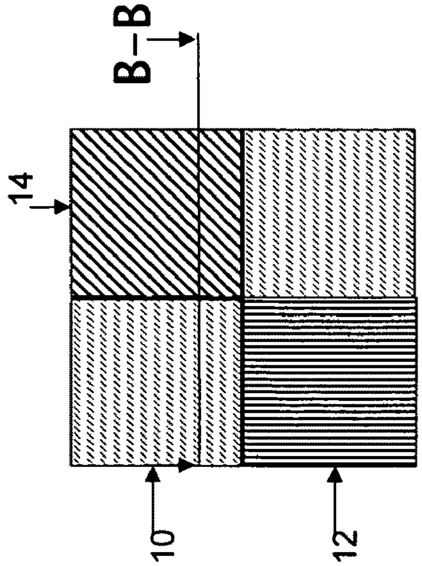
FIG. 1B is a top down view of a portion of a conventional Bayer-patterned color filter array.

Referring now to FIGS. 1B and 1C, FIG. 1B is an overhead view of a conventional Bayer-patterned color filter array 15 (FIG. 1). In the second situation—the errant photon 13 (FIG. 1A)—crosstalk occurs because the errant photon 13 (FIG. 1A) is able to pass through a color filter 2 (FIG. 1A) at a substantial enough angle to cause the errant photon 13 (FIG. 1A) to go through a single color filter 2 (FIG. 1A) which is not associated with the photodetector the errant photon 13 (FIG. 1A) will eventually impact. The errant photon 13 (FIG. 1A) is able to impact an unintended photodetector because uniform color filter sizes only provide a limited range 8 through which the photon must pass through two color filters 2 (FIG. 1A), each filtering different wavelengths of light. Increasing the range 8, through the use of non-uniform size color filters, results in more errant photons 13 (FIG. 1A) passing through two different color filters 2 (FIG. 1A). If an errant photon 13 (FIG. 1A) passes through two color filters 2 (FIG. 1A), its impact is necessarily reduced. For example, if the errant photon 13 (FIG. 1A) has previously passed through a green color filter 10, and the errant photon 13 (FIG. 1A) must then pass through a red color filter 14, the photon's 13 (FIG. 1A) impact is greatly reduced because the red color filter 14 passes only red light, and the red light was previously removed by the green color filter 10.

Figure 2:
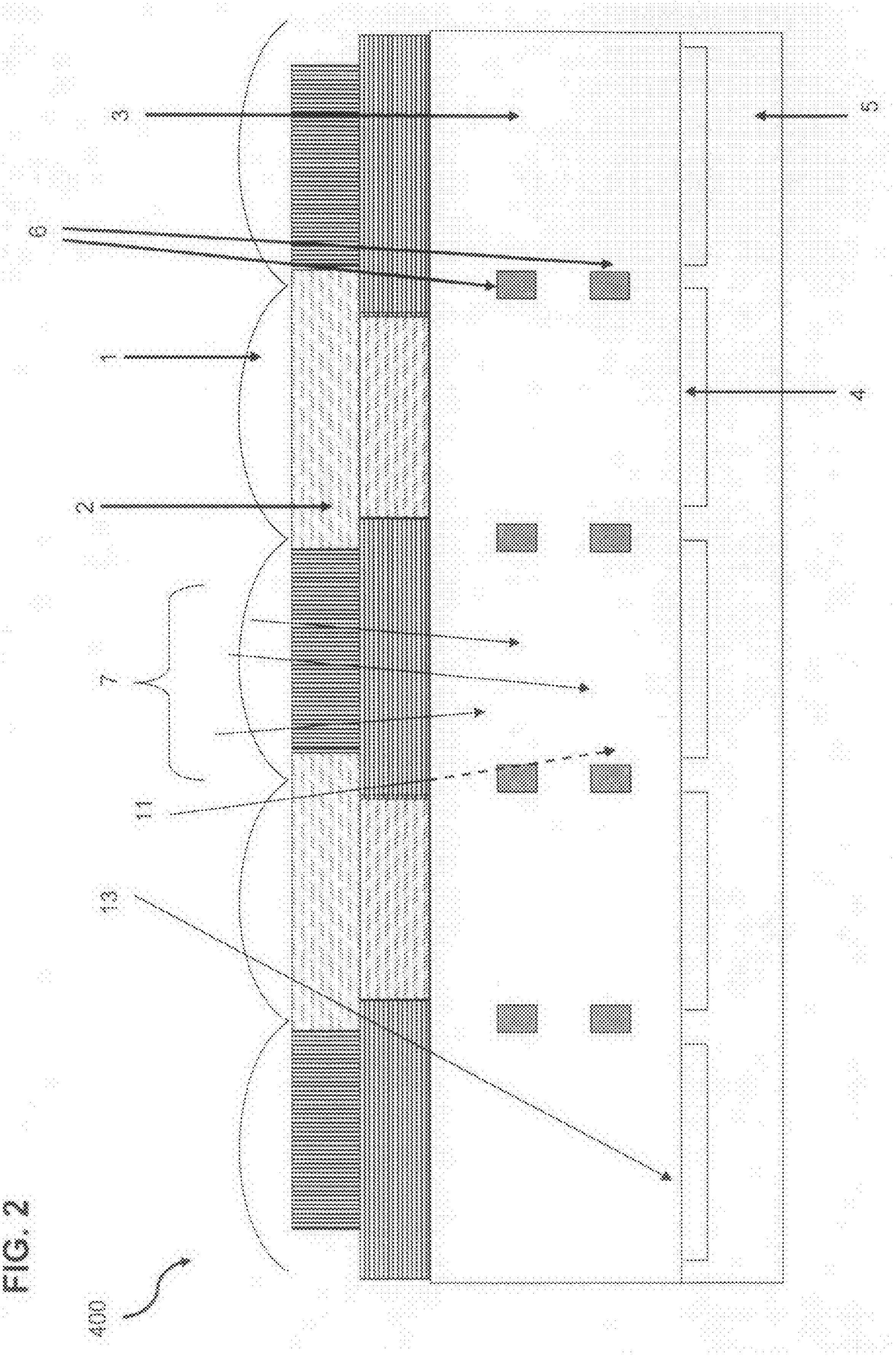
FIG. 2 is a cross-sectional expanded view of an imager pixel array displaying metallization layers with a dual layer color filter array with non-uniform color filter sizes.

Traditionally, the surface area of any individual color filter 2 of a Bayer-patterned color filter array 15 (FIG. 1) is continuous throughout the color filter's depth. Embodiments described herein provide color filter arrays with non-uniform filter sizes such that there is an overlap of one color of filter in an upper portion of the color filter array with a different color filter 2 in an underlying portion of the color filter array at edges of the color filters 2 as shown in FIG. 2. The use of non-uniform filter sizes results in the formation of "majority" and "minority" color filter areas, as opposed to conventional Bayer patterns 15 (FIG. 1), in which all the color filters have equal surface area when viewed from above.

Figure 2B:
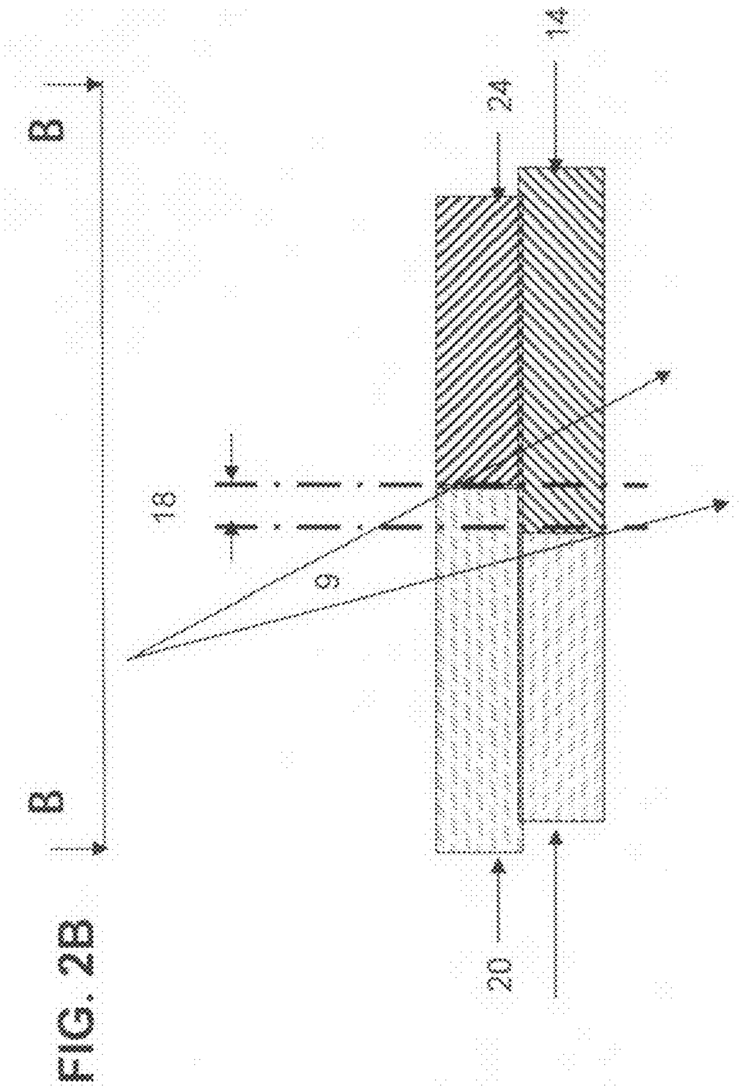
FIG. 2B is a cross-sectional view, along line B-B of FIG. 2A.
Figure 2A:
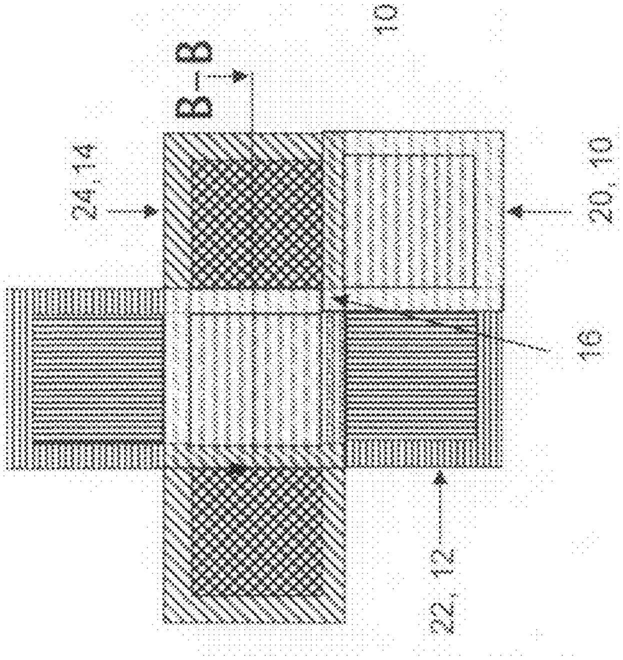
FIG. 2A is a top down view of a modified Bayer pattern color filter array.
Figure 3A:
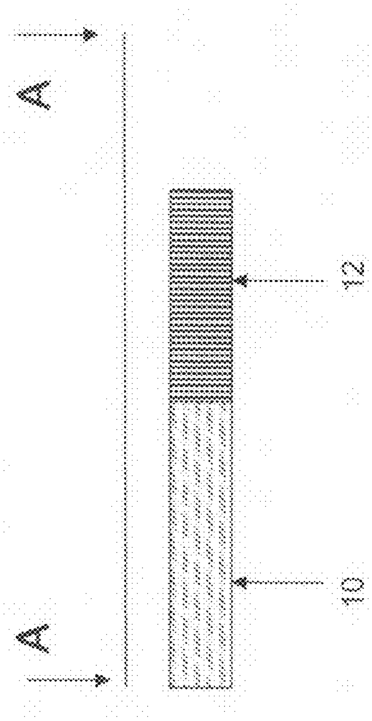
FIG. 3A is a cross-sectional view, along line A-A of FIG. 3.
Figure 3B:
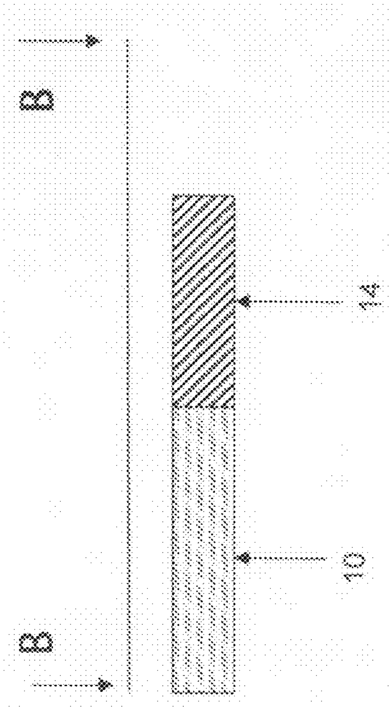
FIG. 3B is a cross-sectional view, along line B-B of FIG. 3.
Figure 3:
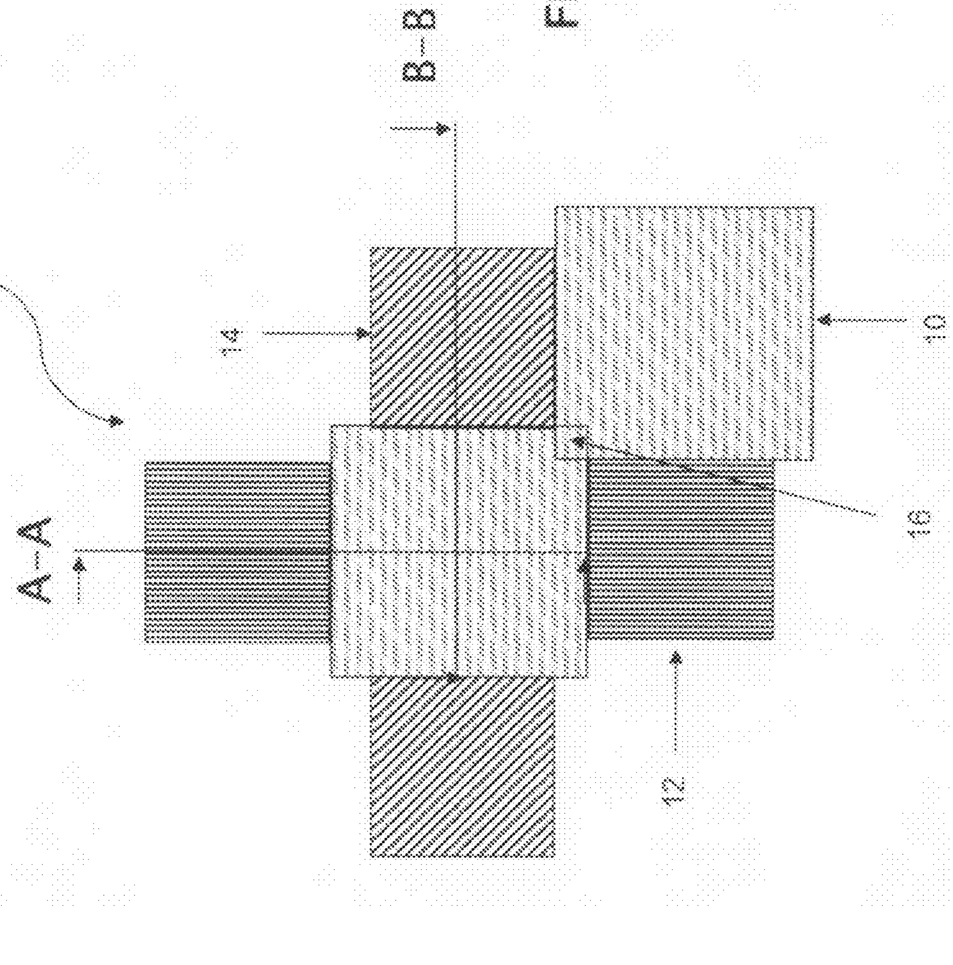
FIG. 3 is a top down view of a modified Bayer pattern color filter array with the green portions of the pattern occupying the majority areas.

A majority area is one occupied by that color filter color (in the case of green 10 color filters occupying the majority areas), or colors (in the case of blue 12 and red 14 color filters occupying the majority areas), which when viewed from overhead occupies the majority of the surface area of the color filter array. In FIG. 2A, the green color filters 10 occupy the majority areas. For purposes of determining majority and minority areas, blue 12 and red 14 color filters are always viewed cumulatively, resulting in either blue 12 and red 14 together occupying the majority areas (FIG. 3C), or blue 12 and red 14 together occupying the minority areas (FIG. 3). Whichever area the blue 12 and red 14 color filters occupy, majority (FIG. 3C) or minority (FIG. 3), they occupy that area together.

Figure 3C:
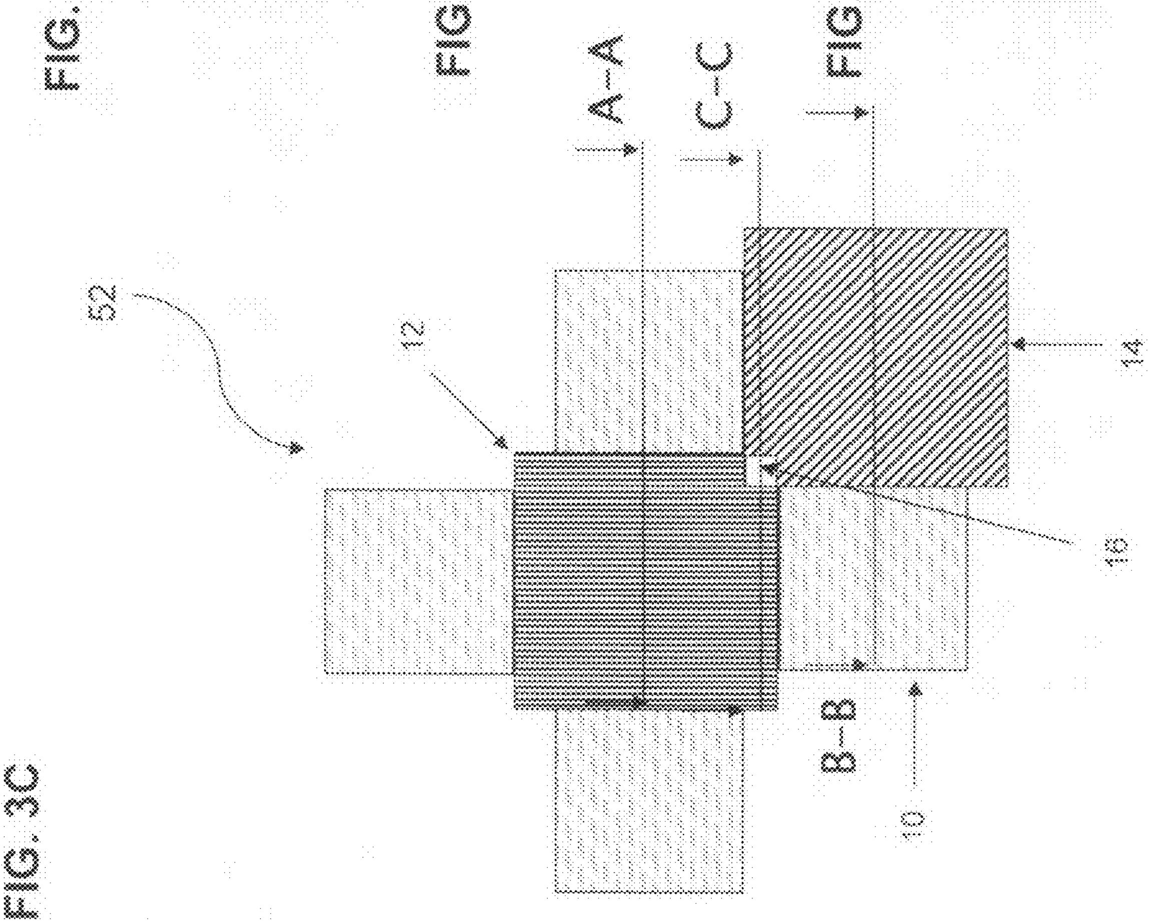
FIG. 3C is a top down view of a modified Bayer pattern color filter array with the red and blue portions of the pattern occupying the majority areas, and neither red nor blue portions occupying the intersect positions.
Figure 3D:
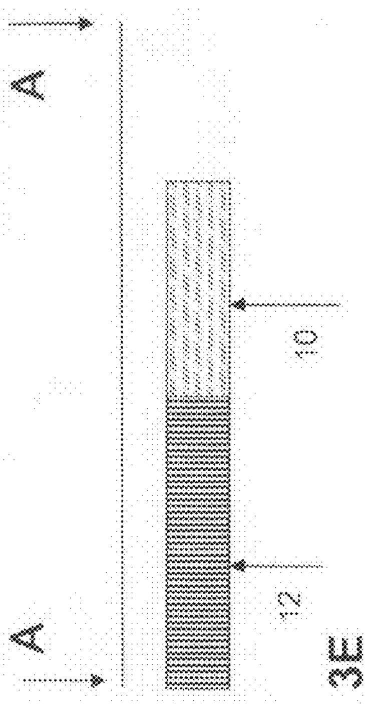
FIG. 3D is a cross-sectional view, along line A-A of FIG. 3C.
Figure 3E:
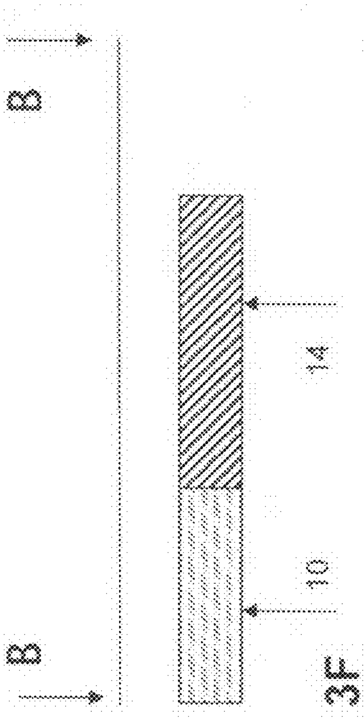
FIG. 3E is a cross-sectional view, along line B-B of FIG. 3C.
Figure 3F:
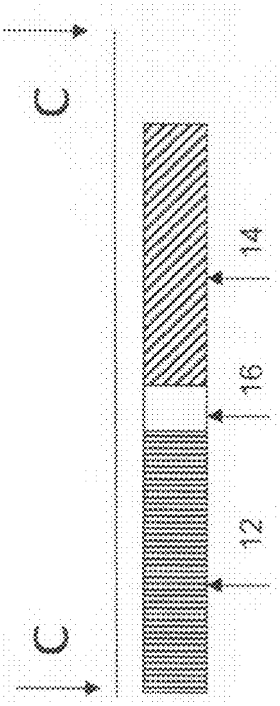
FIG. 3F is a cross-sectional view, along line C-C of FIG. 3C.

The use of non-uniform size color filters, in addition to creating majority and minority areas, also creates "intersect regions," as shown, unfilled, in FIGS. 3C and 3F. Intersect regions 16 occur at the corner intersections of the majority area color filters. When the green color filters 10 occupy the majority areas (FIG. 3), there is no requirement to determine a color distribution within the area of the intersection region 16 because there is only the single choice of green color filter 10 to allocate within the intersect region 16. However, when the blue 12 and red 14 color filters occupy the majority areas (FIG. 3C), then how the intersect regions 16 will be allocated must be determined.

In addition to the structural changes created by non-uniform color filters (i.e., majority and minority positions, and intersect regions), altering the allocation of color filters differently than the conventional Bayer-patterned color filter array 15 (FIG. 1) can result in the reduction of optical crosstalk by reducing the pixel charge packet contamination of adjacent pixels. Pixel charge packet contamination can be reduced with respect to both deflected photons 11, and errant photons 13.

Pixel charge packet contamination is reduced with respect to deflected photons 11 because the deflected photon 11, instead of passing through only one color of color filter 2 (i.e., green), in the case of a non-uniform sized color filter array may pass through two colors of color filter 2 (i.e., green, and blue, as shown in FIG. 2). The deflected photon's 11 passage through multiple color filters 2, each designed to filter different wavelengths of light, necessarily reduces the deflected photon's 11 ability to contaminate the adjacent photodetector that the deflected photon 11 eventually impacts. For example, for a deflected photon 11 that has previously passed through a green color filter 10, which then must pass through a blue color filter 12, the photon's 11 impact is greatly reduced because the blue color filter 12 passes only blue light, and the blue light was previously removed by the green color filter 10. As such, virtually no light is passed, and contamination of the adjacent photodetector is minimized, and optical crosstalk is reduced.

Pixel charge packet contamination is reduced with respect to errant photons 13 because increasing the limited range 8 (FIG. 1C) to the increased range 9 (FIG. 2B) results in a greater number of errant photons 13 having to pass through two color filters 2. Referring now to FIGS. 2A and 2B, FIG. 2A is an overhead view of a dual layer color filter array, while FIG. 2B is a cross-sectional view of FIG. 2A through the line B-B. When the limited range 8 (FIG. 1C) is expanded to an increased range 9, a larger path through which an errant photon 13 (FIG. 2) may travel and still pass through two color filters 2 (FIG. 2), 14 is created. The errant photon's 13 (FIG. 2) passage through multiple color filters 2 (FIG. 2), each designed to filter different wavelengths of light, necessarily reduces the errant photon's 13 (FIG. 2) ability to contaminate the adjacent photodetector that the errant photon 13 (FIG. 2) eventually impacts. For example, for an errant photon 13 that has previously passed through a blue color filter 12, which then must pass through a green color filter 10, the photon's 13 impact is greatly reduced because the green color filter 10 passes only green light, and the green light was previously removed by the blue color filter 12. As such, virtually no light is passed, and contamination of the adjacent photodetector is minimized, and optical crosstalk is reduced.

Another benefit of imager pixels using non-uniform sized color filter arrays is the ability to spectrally tune the color filter for specific uses. By introducing a color filter array which is not a conventional Bayer-patterned color filter array 15 (FIG. 1), numerous aspects of the color filter 2 become tunable for specific applications. These tunable aspects of the color filter array include: (a) allocating intersect regions between the majority filters, (b) selecting the amount of horizontal overlap that occurs within the border regions 17, 18 (FIGS. 4A, 4B) of the color filters 2, (this can also be described as allocating the color filter surface area between the majority and minority filters), (c) selecting the vertical allocation of the multiple layers of color filters 2, (d) selecting the form of the border regions 17, 18 (FIGS. 4A, 4B), and (e) allocating corner regions 44 (FIG. 6) between the majority filters. These opportunities for spectral-response tuning will become clearer as discussed in conjunction with specific embodiments disclosed herein.

Figures 3G, 3H, 3I, 3J:
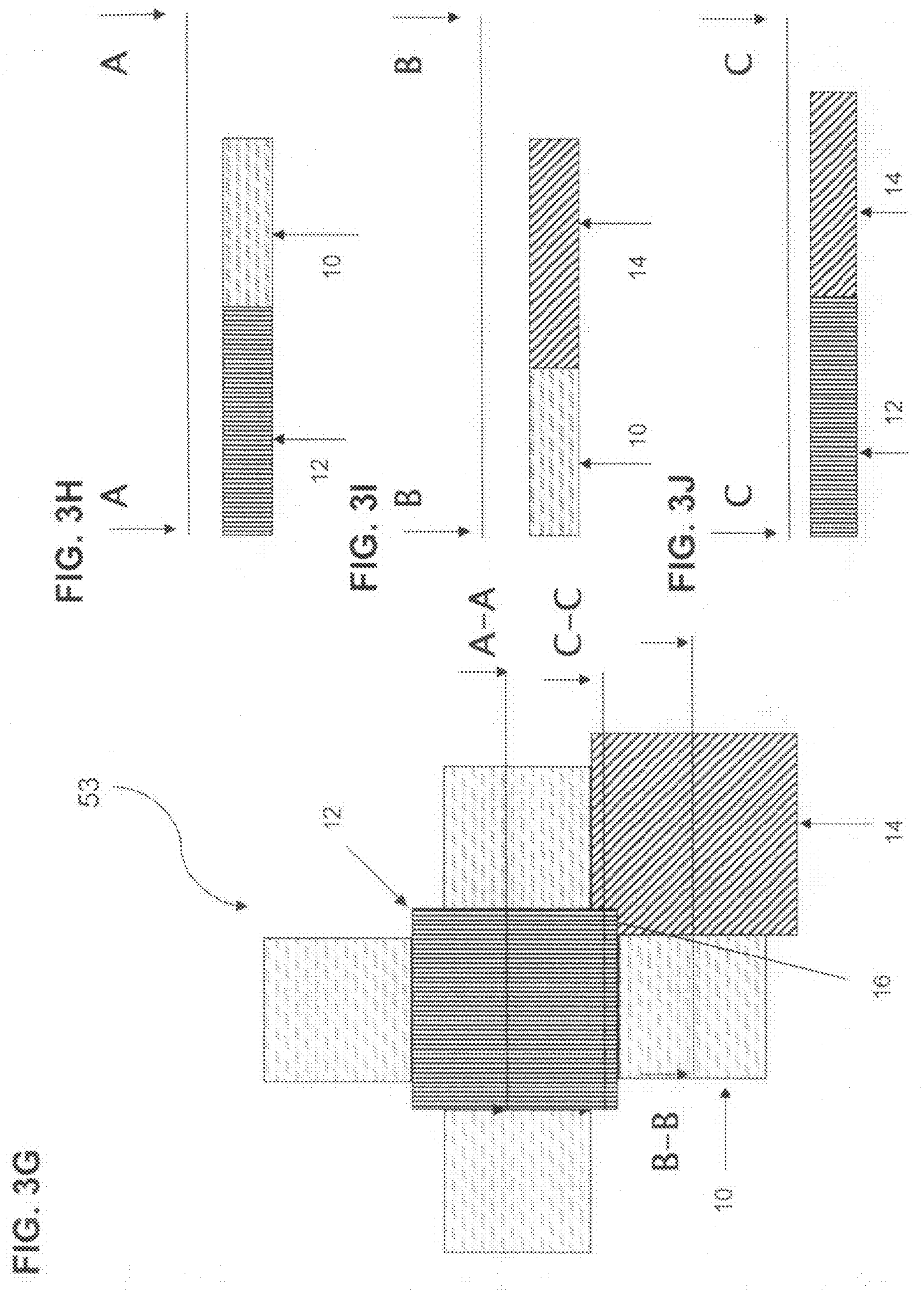
FIG. 3G is a top down view of a modified Bayer pattern color filter array with the red and blue portions of the pattern occupying the majority areas, and blue portions occupying the intersect positions.
FIG. 3H is a cross-sectional view, along line A-A of FIG. 3G.
FIG. 3I is a cross-sectional view, along line B-B of FIG. 3G.
FIG. 3J is a cross-sectional view, along line C-C of FIG. 3G.
Figures 3K, 3L, 3M, 3N:
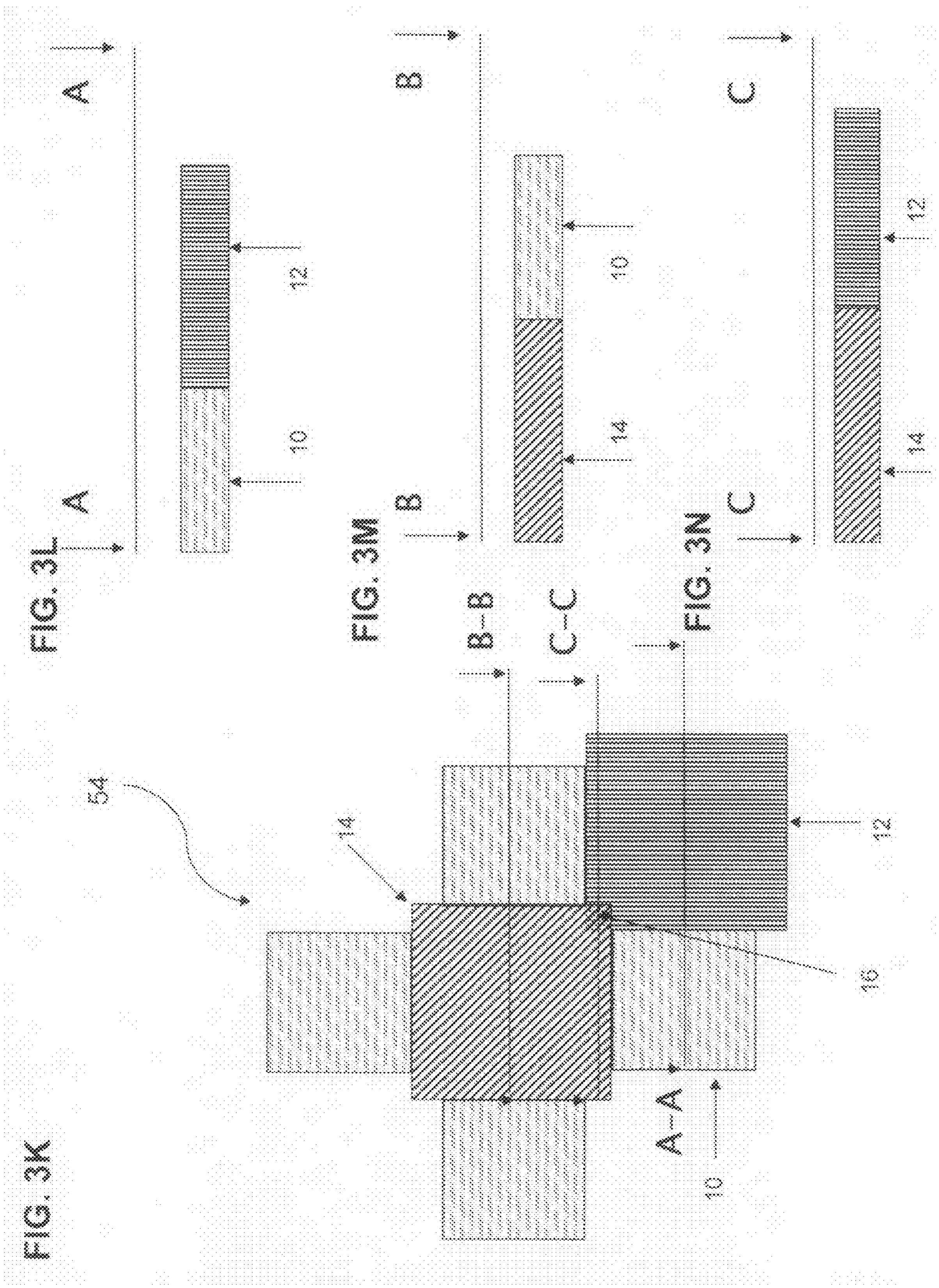
FIG. 3K is a top down view of a modified Bayer pattern color filter array with the red and blue portions of the pattern occupying the majority areas, and red portions occupying the intersect positions.
FIG. 3L is a cross-sectional view, along line A-A of FIG. 3K.
FIG. 3M is a cross-sectional view, along line B-B of FIG. 3K.
FIG. 3N is a cross-sectional view, along line C-C of FIG. 3K.

FIGS. 3-3N show filter elements of different color filter array layers which may be used in forming the first and second embodiments. Referring now to FIGS. 3, 3A, and 3B, FIG. 3 is an overheard view of a color filter array layer 50 where the green 10, blue 12, and red 14 color filters have non-uniform sizes. FIGS. 3A and 3B are cross sectional views of FIG. 3 along lines A-A and B-B, respectively.

Referring now to FIGS. 3C, 3D, 3E, 3F, FIG. 3C is an overhead view of another color filter array layer 52 which may be used in forming certain first and second embodiments, where the blue 12 and red 14 color filters occupy the majority areas, and the green color filters 10 occupy the minority areas. FIGS. 3D, 3E, 3F are cross sectional views of FIG. 3C along lines A-A, B-B, and C-C, respectively. When blue 12 and red 14 color filters occupy the majority areas (FIG. 3C-3N), the intersect regions 16 are allocated between blue 12 and red 14 color filter material. Allocation refers to horizontal allocation of the intersect region 16, and assumes a continuous vertical fill throughout the depth of the layer. Expressed differently, whatever allocation of the intersect region 16 (FIG. 3C) exists on the surface of the layer, will be continuous throughout the depth of that layer. FIGS. 3G and 3J represent one example of intersect region 16 allocation where the blue color filter material 12 completely occupies the intersect region 16. FIGS. 3K and 3N represent a second example of intersect region 16 allocation where the red color filter material 14 completely occupies the intersect region 16. Other intermediate allocations between blue 12 and red 14 color filter material are possible. To represent these potential intermediate allocations, intersect region 16 in FIGS. 3C and 3F is left unfilled. Allocation of the intersect region 16 is one technique for tuning the spectral response of a color filter array.

Referring now to FIGS. 3G, 3H, 3I, 3J, FIG. 3G is an overhead view of another color filter array layer 53, showing a filter element which may be used in forming certain first and second embodiments, where the intersect region 16 is occupied entirely by blue color filter material 12. FIGS. 3H, 3I, 3J are cross sectional views of FIG. 3G along lines A-A, B-B, and C-C, respectively.

Referring now to FIGS. 3K, 3L, 3M, 3N, FIG. 3K is an overhead view of a color filter array layer 54, showing a component which may be used in forming certain first and second embodiments, where the intersect region 16 is occupied entirely by red color filter material 14. FIGS. 3L, 3M, 3N are cross sectional views of FIG. 3K along lines A-A, B-B, and C-C, respectively.

The color filter array layers 50 (FIG. 3, 3A, 3B), 52 (FIG. 3C, 3D, 3E, 3F), 53 (FIG. 3G, 3H, 3I, 3J), 54 (FIG. 3K, 3L, 3M, 3N), that can be a component of the first and second embodiments, are constructed as follows. First, a color filter layer of a single color is fabricated over a pixel array area by any method, such as spin coating and patterning the spin coated layer. Although not required, it is beneficial to make the first color fabricated the color filter which will—when compared with the two other color filters—occupy the greatest surface area of the layer. This limits the amount of material to be removed in subsequent steps. Subsequent steps in this method will assume that the first color filter layer fabricated was a green color filter 10.

In a first method of assembly, depositing of the color filter material (e.g., spin coating), masking, and etching are used to form a pattern of the first color filter material. Once a first color filter material is deposited, a first etching mask is applied to the deposited material and etching is used to create patterns of first color filter material, e.g., green color filter elements 10. The depositing, masking, and etching are repeated to form the red 14 and blue 12 color filter elements. In addition to masking and etching, a second method of assembly including masking and a photo development process can also be used to create a layer containing the patterns of the green 10, blue 12, and red 14 color filter elements. Each of the layers illustrated in FIGS. 3-3N can be assembled using these methods.

The individual single color filter layers illustrated in FIGS. 3-3N are formed with majority and minority color filters such that one color filter layer is stacked over a different color filter layer in a manner in which edges of one color of filter element in one layer overlap with an edge of a different color filter element in an underlying layer. The stacking of various combinations of the layers illustrated in FIGS. 3-3N result in the first and second embodiments described herein.

Figures 4, 4A, 4B:
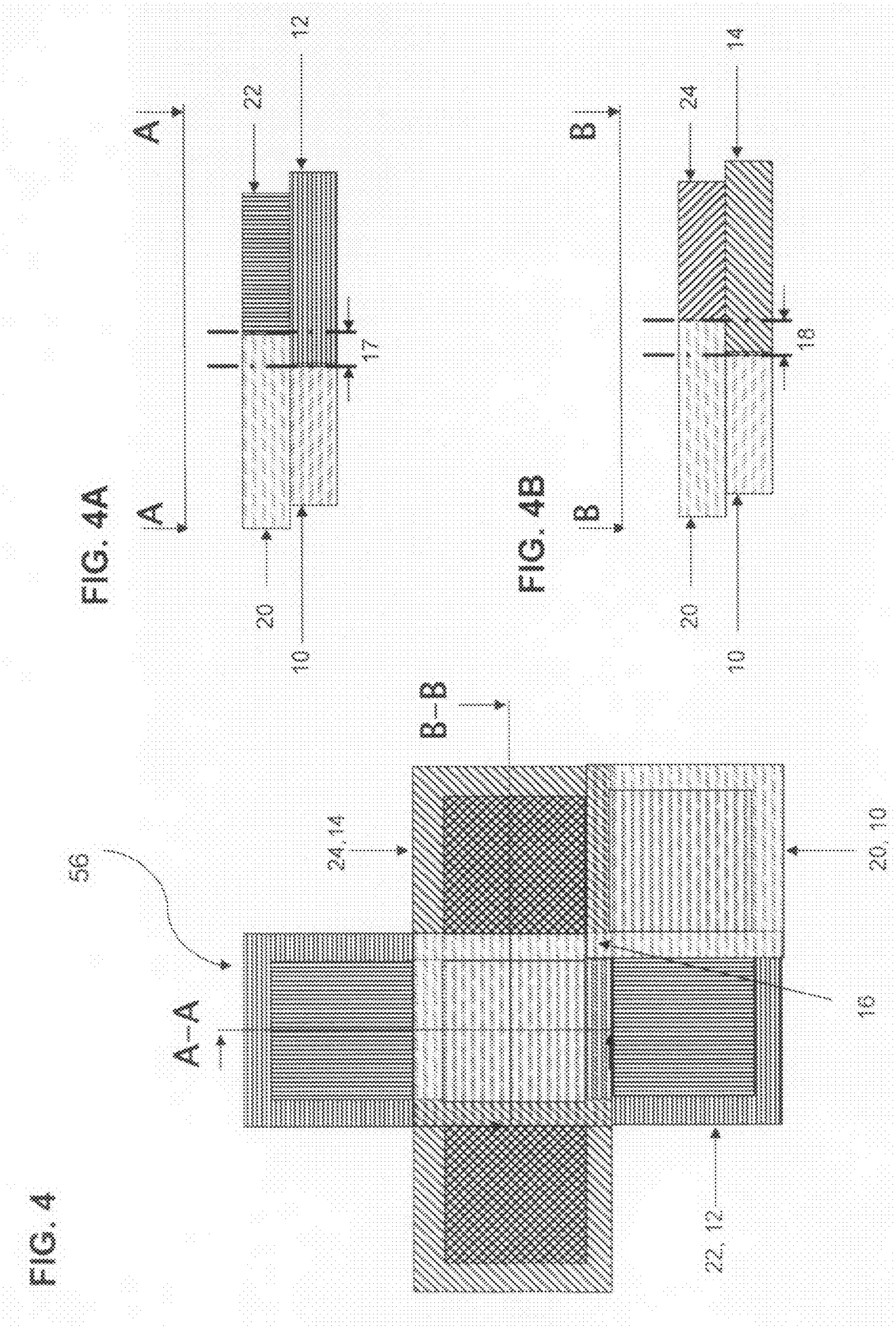
FIG. 4 is a top down view of a dual layer modified Bayer pattern color filter array with the green portions of the pattern occupying the majority areas of the top layer.
FIG. 4A is a cross-sectional view, along line A-A of FIG. 4.
FIG. 4B is a cross-sectional view, along line B-B of FIG. 4.
Figures 4C, 4D, 4E, 4F:
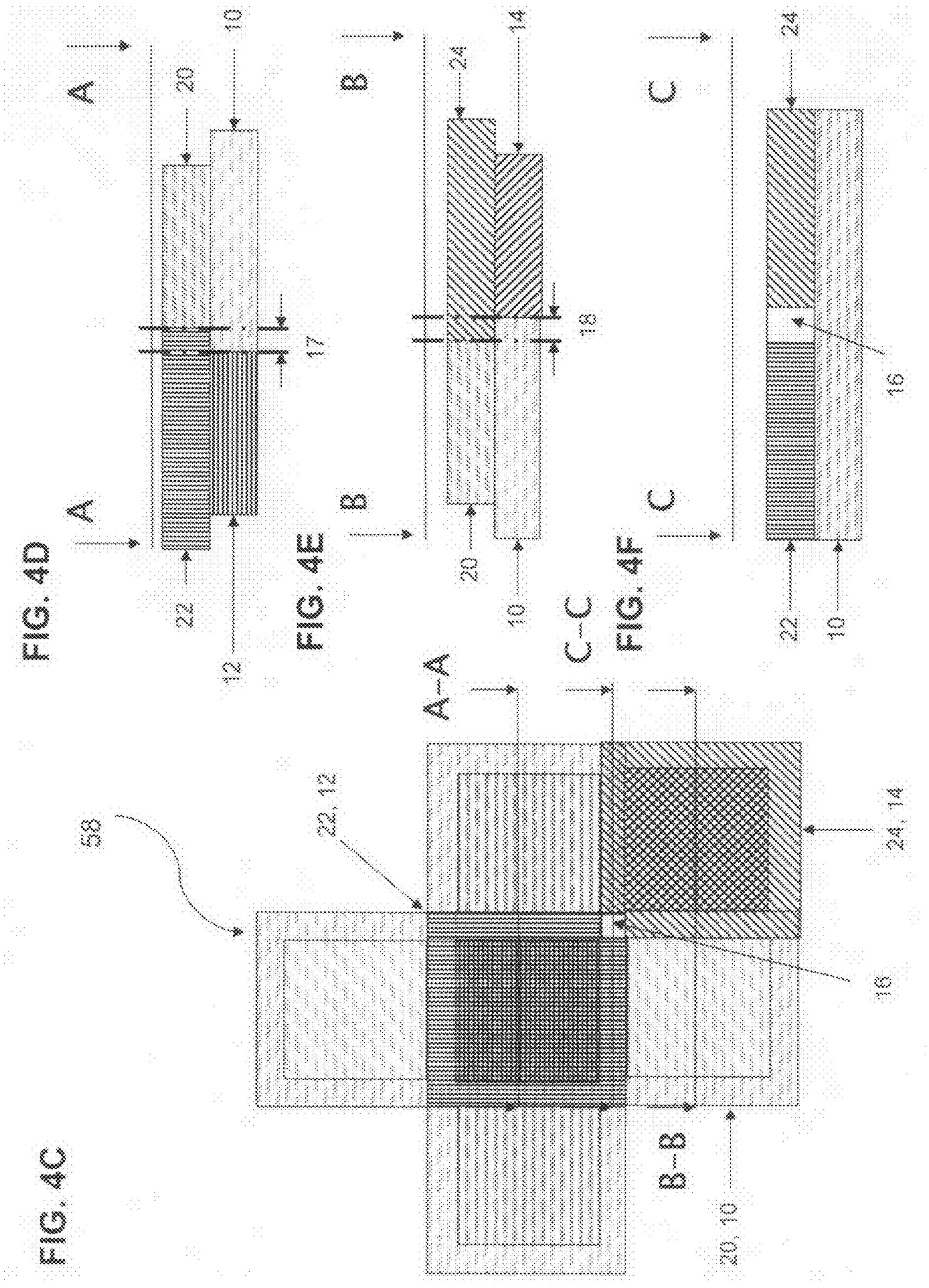
FIG. 4C is a top down view of a dual layer modified Bayer pattern color filter array with the red and blue portions of the pattern occupying the majority areas of the top layer, and neither red nor blue portions occupying the intersect positions of the top layer.
FIG. 4D is a cross-sectional view, along line A-A of FIG. 4C.
FIG. 4E is a cross-sectional view, along line B-B of FIG. 4C.
FIG. 4F is a cross-sectional view, along line C-C of FIG. 4C.
Figures 4G, 4H, 4I, 4J:
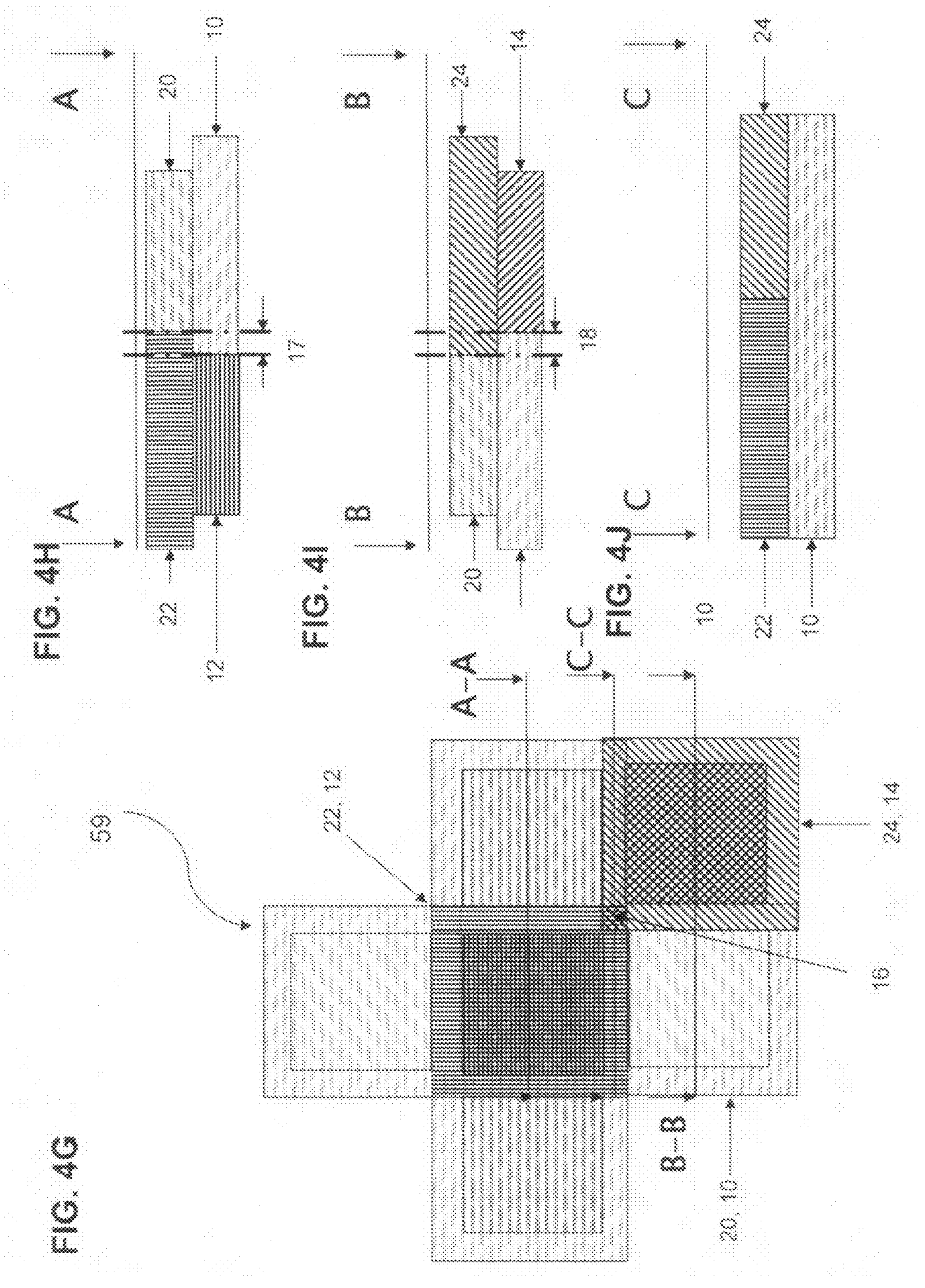
FIG. 4G is a top down view of a dual layer modified Bayer pattern color filter array with the red and blue portions of the pattern occupying the majority areas of the top layer, and the blue portions occupying the intersect positions of the top layer.
FIG. 4H is a cross-sectional view, along line A-A of FIG. 4G.
FIG. 4I is a cross-sectional view, along line B-B of FIG. 4G.
FIG. 4J is a cross-sectional view, along line C-C of FIG. 4G.
Figures 4K, 4L, 4M, 4N:
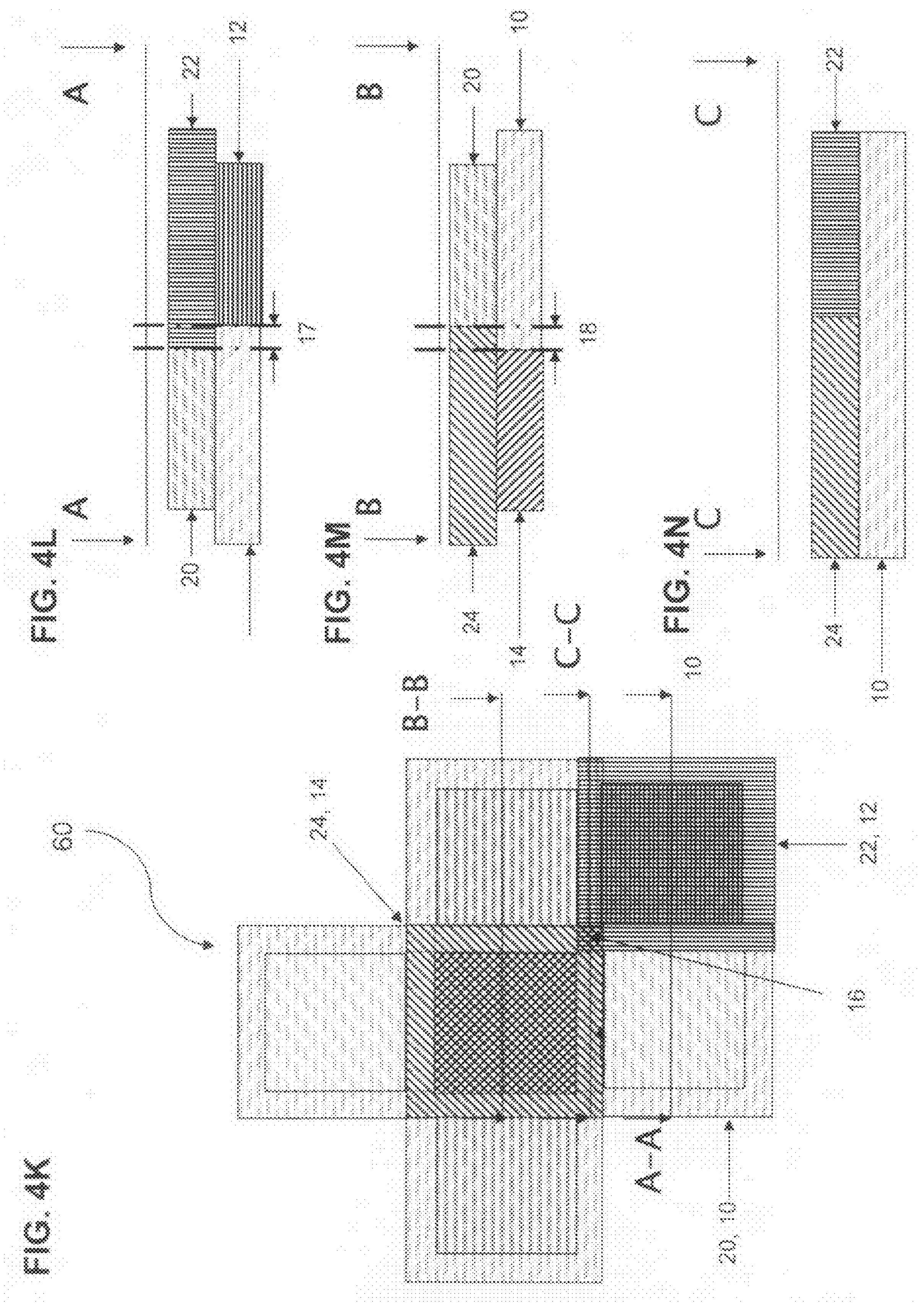
FIG. 4K is a top down view of a dual layer modified Bayer pattern color filter array with the red and blue portions of the pattern occupying the majority areas of the top layer, and the red portions occupying the intersect positions of the top layer.
FIG. 4L is a cross-sectional view, along line A-A of FIG. 4K.
FIG. 4M is a cross-sectional view, along line B-B of FIG. 4K.
FIG. 4N is a cross-sectional view, along line C-C of FIG. 4K.

Referring now to a first embodiment, a dual layer color filter array 56 (FIGS. 4, 4A, 4B) is made up of a top layer shown as color filter array layer 50 (FIGS. 3, 3A, 3B), and a bottom layer which may be one of the color filter array layers 52 (FIGS. 3C, 3D, 3E, 3F), 53 (FIGS. 3G, 3H, 3I, 3J), and 54 (FIGS. 3K, 3L, 3M, 3N). In color filter array 56, an upper majority green color filter 20 is substantially aligned over a lower minority green color filter 10 (FIG. 4A); an upper minority blue color filter 22 is substantially aligned over a lower majority blue color filter 12 (FIG. 4A); and an upper minority red color filter 24 is substantially aligned over a lower majority red color filter 14 (FIG. 4B). This configuration results in the creation of a green-blue border region 17 (FIG. 4A) at overlapping edge areas of the upper green 20 and lower blue 12 color filters, and a green-red border region 18 (FIG. 4B) at overlapping edge areas of the upper green 20 and lower red 14 color filters.

"Border regions" 17, 18 are created where color filters 10, 12, 14, 20, 22, 24, 30, 32, 34 interface with one another. A border region 17, 18 is a region where light entering the region at an angle perpendicular to the surface of the color filter array, will pass through more than one different color filter. A green-blue border region 17 is one where light passes through a green 10, 20, 30 and blue 12, 22, 32 color filter. A green-red border region 18 is one where light passes through a green 10, 20, 30 and red 14, 24, 34 color filter. Determining the amount of horizontal overlap that occurs within a border region 17, 18 can be used to tune the spectral response of a color filter array.

An additional technique for tuning the spectral response of a multilayered color filter array is to allocate the size of levels vertically. Every figure within the specification shows a top and bottom layer (and middle layer in those embodiments with a middle layer) which are identical in height. For example, as shown in FIG. 4, the height of the top layer green color filter 20 equals the height of the lower layer green color filter 10. Identical heights among multiple layers, however, are not required. Varying the percentage of the overall color filter array height allocated to each layer within the color filter array can be used to tune the spectral response of a color filter array.

Referring now to a variation of the first embodiment, the dual layer color filter array 58 (FIGS. 4C, 4D, 4E, 4F) is similar to color filter array 56 (FIGS. 4, 4A, 4B) except the top layer is color filter array layer 52 (FIGS. 3C, 3D, 3E, 3F), and the bottom layer is color filter array layer 50 (FIGS. 3, 3A, 3B). The unfilled intersect regions 16 may be allocated between blue 12 and red 14 color filter materials.

Referring now to a second variation of the first embodiment, the dual layer color filter array 59 (FIGS. 4G, 4H, 4I, 4J) is similar to the color filter array 58 (FIGS. 4C, 4D, 4E, 4F), except the top layer is color filter array layer 53 (FIGS. 3G, 3H, 3I, 3J).

Referring now to a third variation of the first embodiment, the dual layer color filter array 60 (FIGS. 4K, 4L, 4M, 4N) is similar to the color filter array 58 (FIGS. 4C, 4D, 4E, 4F), except the top layer is color filter array layer 54 (FIGS. 3K, 3L, 3M, 3N).

The color filter arrays 56 (FIGS. 4, 4A, 4B), 58 (FIGS. 4C, 4D, 4E, 4F), 59 (FIGS. 4G, 4H, 4I, 4J), and 60 (FIGS. 4K, 4L, 4M, 4N) are constructed as follows. The bottom color filter array layer, which is one of layers 50 (FIGS. 3, 3A, 3B), 52 (FIGS. 3C, 3D, 3E, 3F), 53 (FIGS. 3G, 3H, 3I, 3J), 54 (FIGS. 3K, 3L, 3M, 3N) is first formed using either the etching or exposing methods described above for FIGS. 3-3N. If the bottom color filter array layer is color filter array layer 50 (FIGS. 3, 3A, 3B), then the top color filter array layer is one of color filter array layer 52 (FIGS. 3C, 3D, 3E, 3F), 53 (FIGS. 3G, 3H, 3I, 3J), and 54 (FIGS. 3K, 3L, 3M, 3N). If the bottom color filter layer is one of color filter array layers 52 (FIGS. 3C, 3D, 3E, 3F), 53 (FIGS. 3G, 3H, 3I, 3J), and 54 (FIGS. 3K, 3L, 3M, 3N), then the top color filter array layer is color filter array layer 50 (FIGS. 3, 3A, 3B). In either case, the top color filter array layer is created using a method as set forth above for color filter array layers 50 (FIGS. 3, 3A, 3B), 52 (FIGS. 3C, 3D, 3E, 3F), 53 (FIGS. 3G, 3H, 3I, 3J), 54 (FIGS. 3K, 3L, 3M, 3N). The top layer can be formed only after the bottom layer has been formed. In forming the top layer, the etch masks or exposure masks are placed to ensure that majority and minority portions of like colors filters are paired and substantially centered in relation to one another. This configuration creates the overlapping green-blue border regions 17 (FIGS. 4A, 4D, 4H, 4L) and green-red border regions 18 (FIGS. 4B, 4E, 4I, 4M).

Figure 5A:
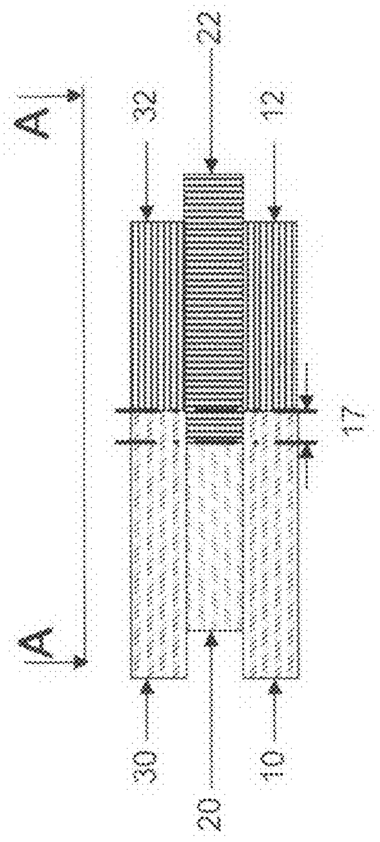
FIG. 5A is a cross-sectional view, along line A-A of FIG. 5.
Figure 5B:
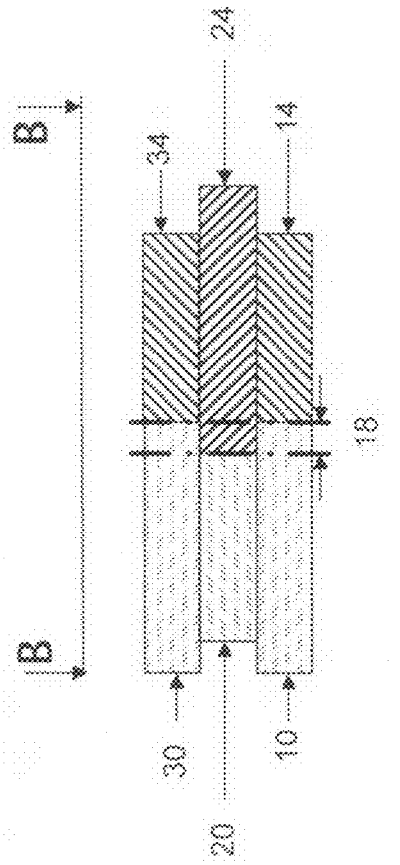
FIG. 5B is a cross-sectional view, along line B-B of FIG. 5.
Figure 5:
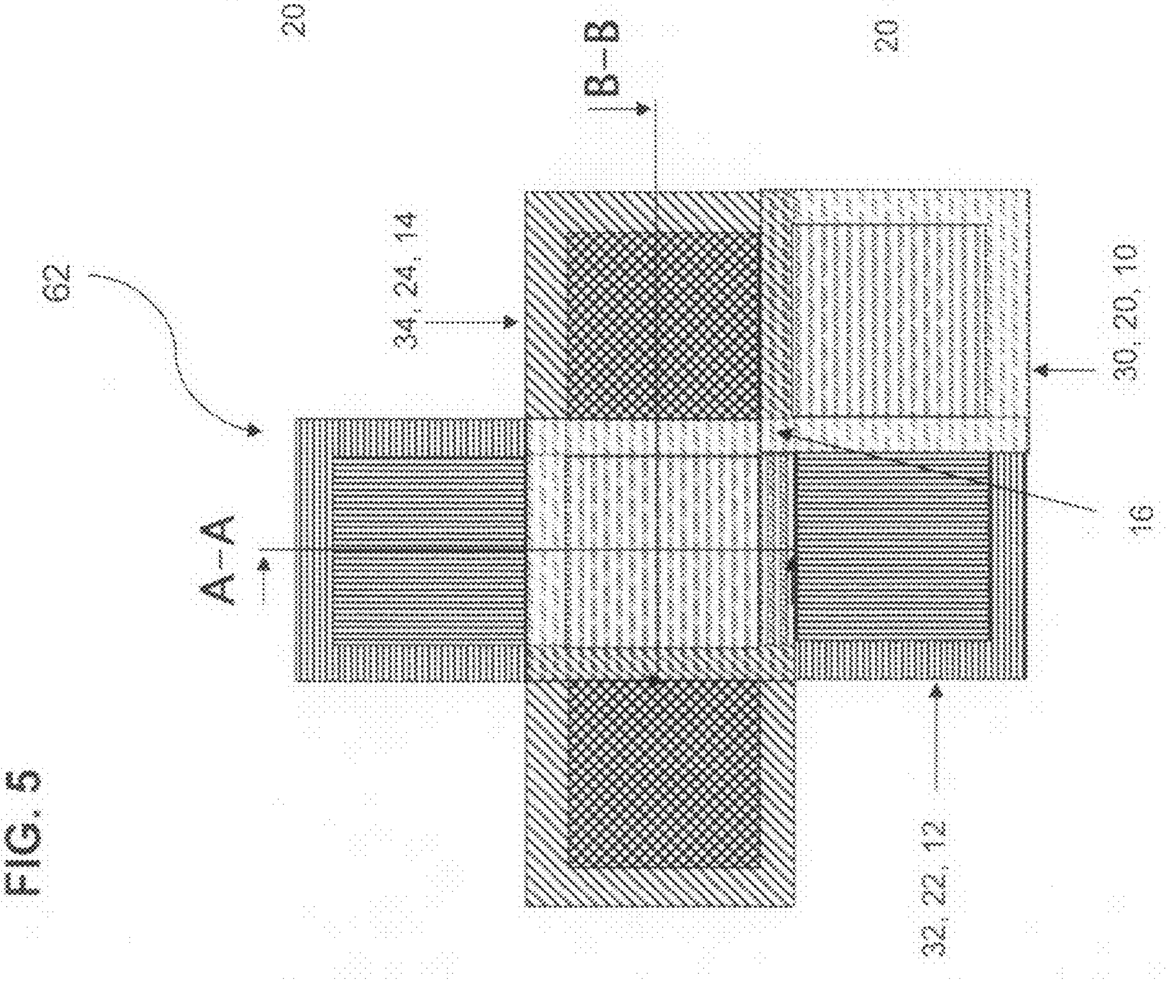
FIG. 5 is a top down view of a triple layer modified Bayer pattern color filter array with the green portions of the pattern occupying the majority areas of the top and bottom layers.

Referring now to a second embodiment, a three layer color filter array 62 (FIGS. 5, 5A, 5B) is shown which is similar to the color filter array 56 (FIGS. 4, 4A, 4B) with the addition of a color filter array layer 50 (FIGS. 3, 3A, 3B) at the bottom that is similar to the top layer color filter array layer. In color filter array 62 the top layer is a color filter array layer 50 (FIGS. 3, 3A, 3B), the middle color filter array layer is one of a color filter array layer 52 (FIGS. 3C, 3D, 3E, 3F), 53 (FIGS. 3G, 3H, 3I, 3J), and 54 (FIGS. 3K, 3L, 3M, 3N), and the bottom color filter array layer is color filter array layer 50 (FIGS. 3, 3A, 3B). In color filter array 62 majority green color filters 10, 30 are substantially centered above and below, respectively, minority green color filter 20 (FIG. 5A); minority blue color filters 12, 32 are substantially centered above and below, respectively, majority blue color filter 22 (FIG. 5A); and minority red color filters 14, 34 are substantially centered above and below, respectively, majority red color filter 24 (FIG. 5B). This configuration creates the green-blue border regions 17 (FIG. 5A) and green-red border regions 18 (FIG. 5B).

Referring now to a variation of the second embodiment, the three layer color filter array 64 (FIGS. 5C, 5D, 5E, 5F) is similar to color filter array 58 (FIGS. 4C, 4D, 4E, 4F) with the addition of color filter array layer 52 (FIGS. 3C, 3D, 3E, 3F) as a bottom layer. The configuration of color filter array 64 is similar to that described above for color filter array 62 (FIGS. 5, 5A, 5B), except that the majority color filters 32, 12, and 34, 14 are substantially centered above and below, respectively, minority color filters 22 and 24 (FIGS. 5D, 5E), and minority color filters 30 and 10 are substantially centered above and below, respectively, majority color filter 20 (FIG. 5D). This configuration creates the green-blue border regions 17 (FIG. 5D) and green-red border regions 18 (FIG. 5E). As illustrated, color filter array 64 includes two layers in which the unfilled intersect regions 16 may be allocated between blue 12 and red 14 color filter materials. Additionally, these two intersect regions 16 (one between the blue 32 and red 34 color filter elements, the second between the blue 12 and red 14 color filter elements) may have independent allocations of blue 12 and red 14 color filter material. For example, and not intended to be limiting, a color filter array 64 could have: a top-layer intersect region 16 filled such that the left 75% (a continuous vertical fill exists throughout the depth of the layer) of the intersect region 16 is blue color filter material 32, and the remaining 25% of the intersect region 16 is red color filter material 34; and a bottom-layer intersect region 16 filled such that the left 33% of the intersect region 16 is blue color filter 12, and the remaining 67% of the intersect region is red color filter material 14.

Referring now to a second variation of the second embodiment, the three layer color filter array 65 (FIGS. 5G, 5H, 5I, 5J) is similar to color filter array 64 (FIGS. 5C, 5D, 5E, 5F) except that the blue color filters 32, 12 of the top and bottom layers occupy the intersect region 16 (FIG. 5J).

Figures 5K, 5L, 5M, 5N:
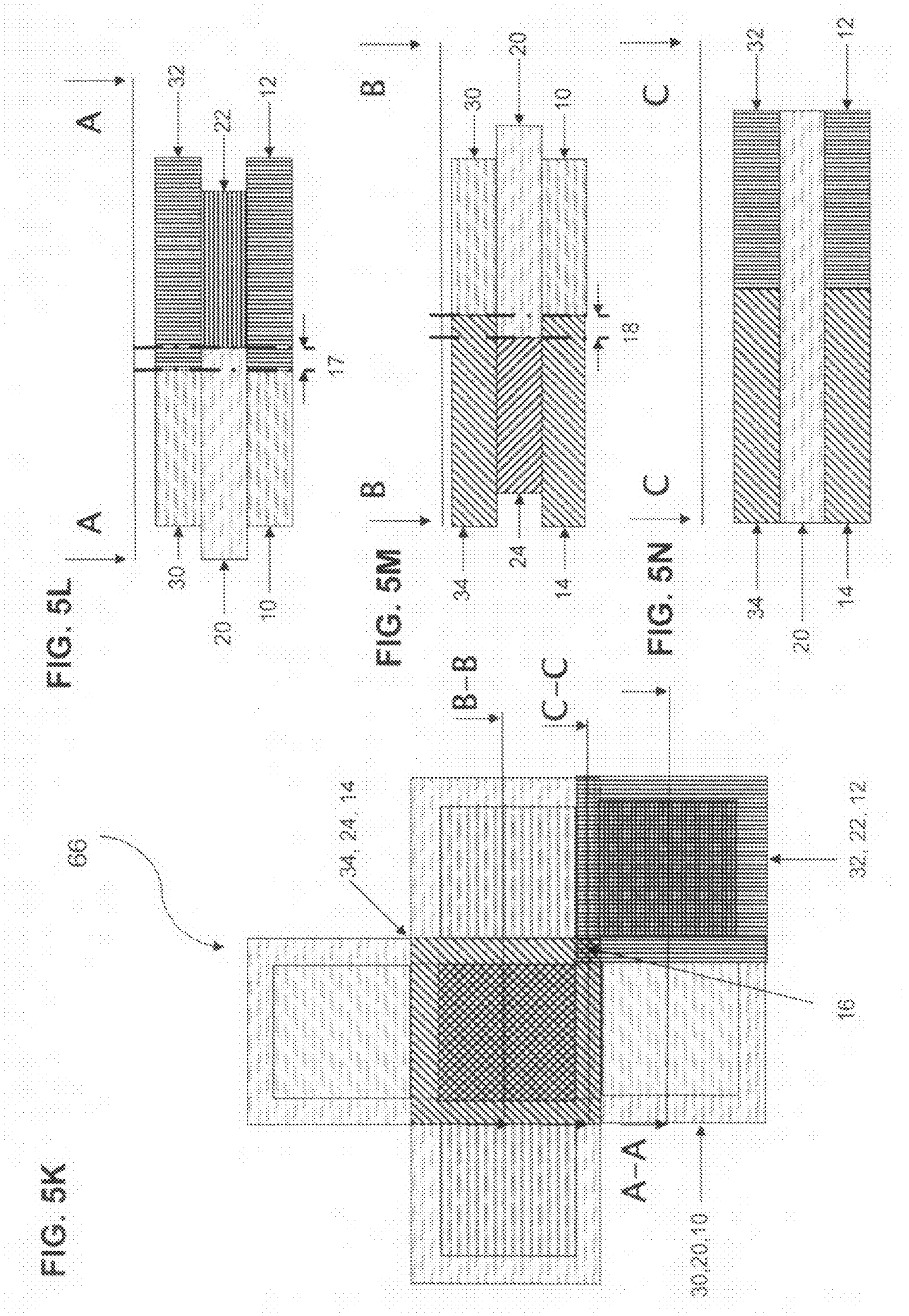
FIG. 5K is a top down view of a triple layer modified Bayer pattern color filter array with the red and blue portions of the pattern occupying the majority areas of the top and bottom layers and the red portions occupying the intersect positions of the top and bottom layers.
FIG. 5L is a cross-sectional view, along line A-A of FIG. 5K.
FIG. 5M is a cross-sectional view, along line B-B of FIG. 5K.
FIG. 5N is a cross-sectional view, along line C-C of FIG. 5K.

Referring now to a third variation of the second embodiment, the three layer color filter array 66 (FIGS. 5K, 5L, 5M, 5N) is similar to color filter array 65 (FIGS. 5G, 5H, 5I, 5J) except that the red color filters 34, 14 of the top and bottom layers occupy the intersect region 16 (FIG. 5N).

The color filter arrays 62 (FIGS. 5, 5A, 5B), 64 (FIGS. 5C, 5D, 5E, 5F), 65 (FIGS. 5G, 5H, 5I, 5J), and 66 (FIGS. 5K, 5L, 5M, 5N) are constructed as follows. For the bottom color filter array layer, one of 50 (FIGS. 3, 3A, 3B), 52 (FIGS. 3C, 3D, 3E, 3F), 53 (FIGS. 3B), and 54 (FIG. 3G, 3H, 3I, 3J) is created using either the etching or exposing methods described above for color filter arrays 50 (FIGS. 3, 3A, 3B), 52 (FIGS. 3C, 3D, 3E, 3F), 53 (FIGS. 3G, 3H, 3I, 3J), and 54 (FIG. 3K, 3L, 3M, 3N), respectively. In embodiments where the bottom and top color filter array layer is a color filter array layer 50 (FIGS. 3, 3A, 3B) (i.e., color filter array 62) then the middle layer is one of color filter array layers 52 (FIGS. 3C, 3D, 3E, 3F), 53 (FIGS. 3G, 3H, 3I, 3J), and 54 (FIGS. 3K, 3L, 3M, 3N). If the bottom and top color filter layer is one of color filter array layers 52 (FIGS. 3C, 3D, 3E, 3F), 53 (FIGS. 3G, 3H, 3I, 3J), and 54 (FIGS. 3K, 3L, 3M, 3N) (i.e., color filter array 64, 65, 66) then the middle layer is color filter array layer 50 (FIGS. 3, 3A, 3B). In either case, the middle layer is created using a method as set forth above for color filter array layers 50 (FIGS. 3, 3A, 3B), 52 (FIGS. 3C, 3D, 3E, 3F), 53 (FIGS. 3G, 3H, 3I, 3J), and 54 (FIGS. 3K, 3L, 3M, 3N). The top layer can be formed only after the middle layer has been formed, and the middle layer can be formed only after the top layer has been formed. The top layer is created over the middle layer in a position similar to the location of the bottom layer. In forming the top layer, the etch or exposure masks are placed to ensure that majority and minority portions of like colors are paired and substantially centered in relation to one another. This configuration creates the green-blue border regions 17 (FIGS. 5A, 5D, 5H, 5L) and green-red border regions 18 (FIGS. 5B, 5E, 5I, 5M). The top color filter array layer is created using a method as set forth above for color filter array layers 50 (FIGS. 3, 3A, 3B), 52 (FIGS. 3C, 3D, 3E, 3F), 53 (FIGS. 3G, 3H, 3I, 3J), and 54 (FIGS. 3K, 3L, 3M, 3N).

Figure 6:
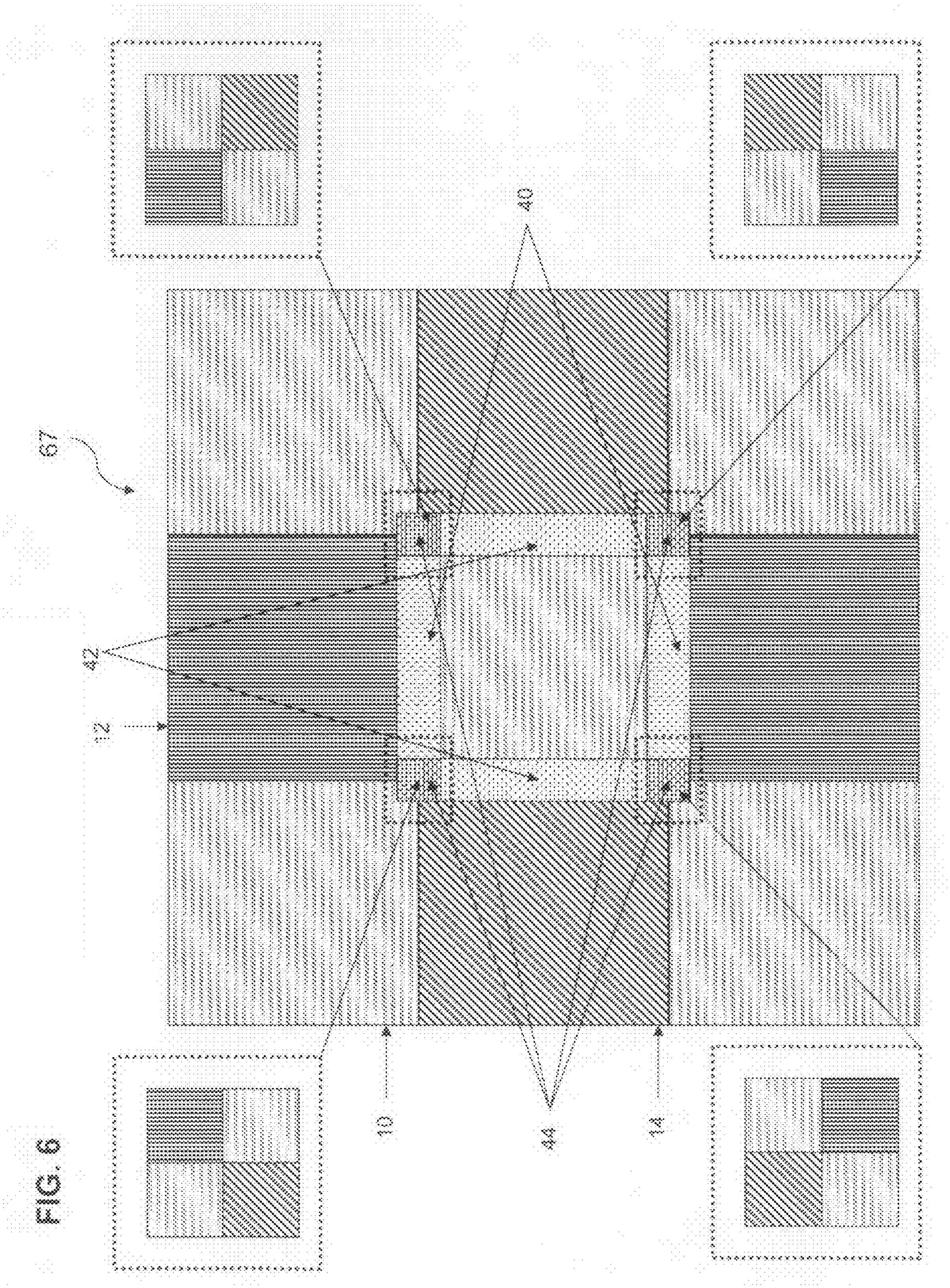
FIG. 6 is a top down view of a modified Bayer pattern color filter array with blue-green fill regions, red-green fill regions, and corner regions delineated.

FIG. 6 is a top down view of a portion of a single layer color filter array 67 with blue-green fill regions 40, red-green fill regions 42, and corner regions 44 that are fabricated over the center green color filter 10 of a conventional Bayer-patterned color filter array 15 (FIG. 1). The blue-green fill region 40 is a region substantially parallel to a border of a green color filter 10 and a blue color filter 12 which extends a certain distance from the interface of the green 10 and blue 12 color filters into both the green 10 and blue 12 color filters. The color filter array 67 of FIG. 6 shows the blue-green fill regions 40 extending an equal distance into both the green 10 and blue 12 color filters, but the extension into each color filter does not have to be equal. The red-green fill regions 42 are as described above for the blue-green fill regions 40, except they occur at the interface of green 10 and red 14 color filters. Both the blue-green 40 and red-green 42 fill regions are regions of a conventional Bayer-patterned color filter array 15 (FIG. 1) which are modified to create color filter arrays 68 (FIGS. 6A, 6B, 6C), 70 (FIGS. 6D, 6E, 6F), 72 (FIGS. 6G, 6H, 6I), 74 (FIGS. 7-7B), 76 (FIGS. 7C-7E), 78 (FIGS. 7F-7H). The sizes of the blue-green 40 and red-green 42 fill regions corresponds directly to the border regions 17, 19 shown in FIGS. 6B, 6C, 6E, 6F, 6H, 6I, 7A, 7B, 7D, 7E, 7G, and 7H. Determining the amount of horizontal overlap that occurs within a border region 17, 18 is one technique for tuning the spectral response of a color filter array.

Corner regions 44 are regions occurring at the corner intersection of two green 10, one blue 12, and one red 14 color filter. The size of a corner region 44 is determined by the dimensions selected for the blue-green 40 and red-green 42 fill regions. Corner regions 44 can undergo their own modification—depositing, masking, and etching, or depositing masking and photo development—prior to, or after, modifying the blue-green 40 and red-green 42 fill regions. Corner regions 44 can be modified where specific applications warrant changing the corner region 44 to have a specific allocation between green 10, blue 12, and red 14 color filter elements. Alternatively, the corner regions 44 can be left with the same color filter allocation they possess in their conventional Bayer-patterned 15 (FIG. 1) form. In FIG. 6 each corner region 44 is shown in an expanded view that details what its color filter arrangement is if the corner region 44 is left unmodified. Determining the allocation of corner regions 44 can be used to tune the response of a color filter array.

Figure 6B:
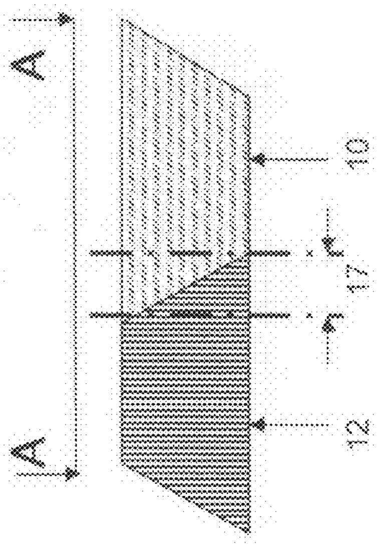
FIG. 6B is a cross-sectional view, along line A-A of FIG. 6A.
Figure 6C:
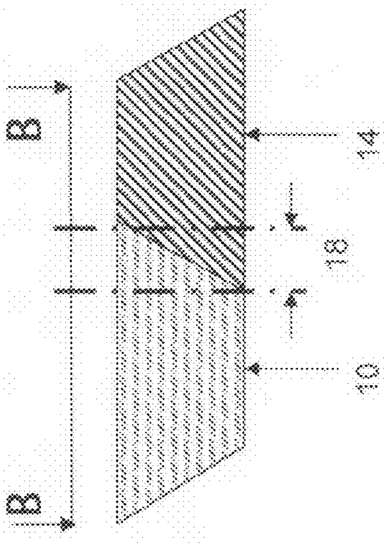
FIG. 6C is a cross-sectional view, along line B-B of FIG. 6A.
Figure 6A:
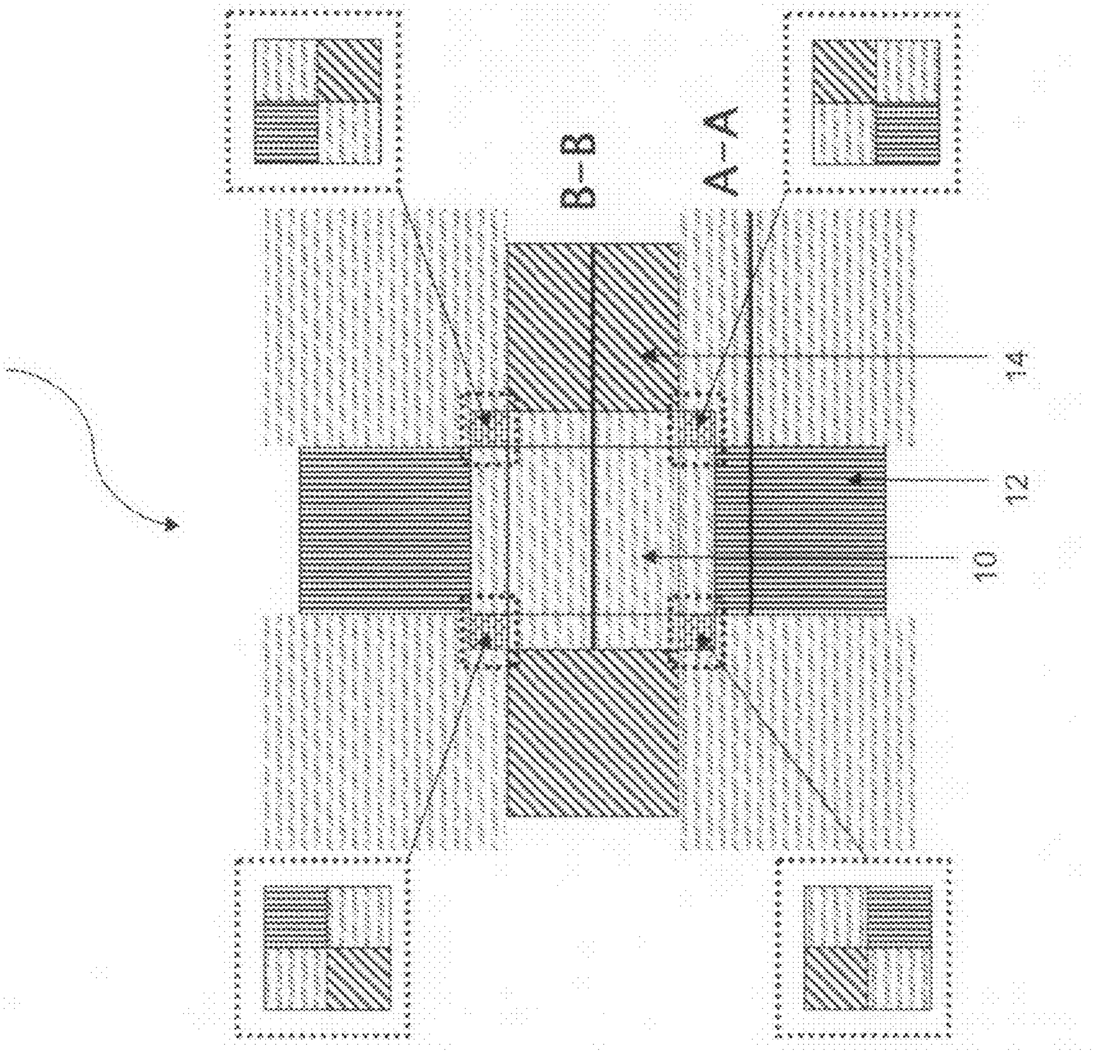
FIG. 6A is a top down view of a single layer modified Bayer pattern color filter array with angled sidewalls with the green portions of the pattern occupying the majority areas.

Referring now to a third embodiment, FIGS. 6A, 6B, and 6C are top down and cross-sectional views of a single layer color filter array 68 where the green 10, blue 12, and red 14, color filters do not have a uniform area across their respective depths. Instead, the green color filters 10, occupying the majority areas, have inward-tapered sidewalls. Conversely, the blue 12 and red 14 color filters, occupying the minority areas, have outward-tapered sidewalls that correspond to the inward-tapered sidewalls of the green color filter 10. The arrangement of the tapered sidewalls of the green 10, blue 12, and red 14 color filters creates a green-blue border region 17 (FIG. 6B) and a green-red border region 18 (FIG. 6C). Selecting the form of the border region 17, 18, (i.e., tapered sidewalls of the third embodiment or sidewalls formed by multiple layers of color filter arrays as in the first and second embodiments) can be used for tuning the response of a color filter array.

Figure 6E:
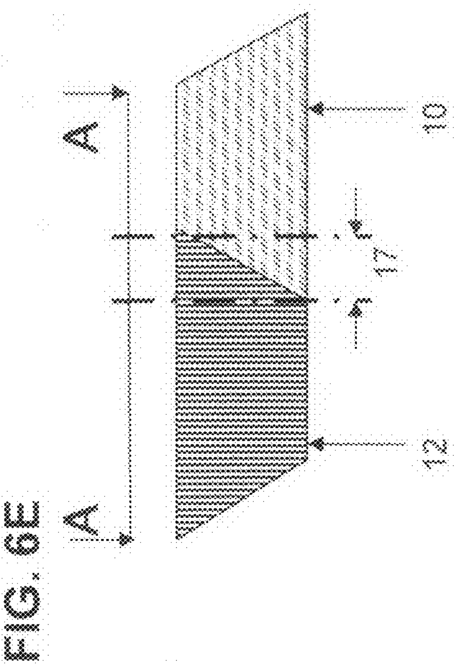
FIG. 6E is a cross-sectional view, along line A-A of FIG. 6D.
Figure 6F:
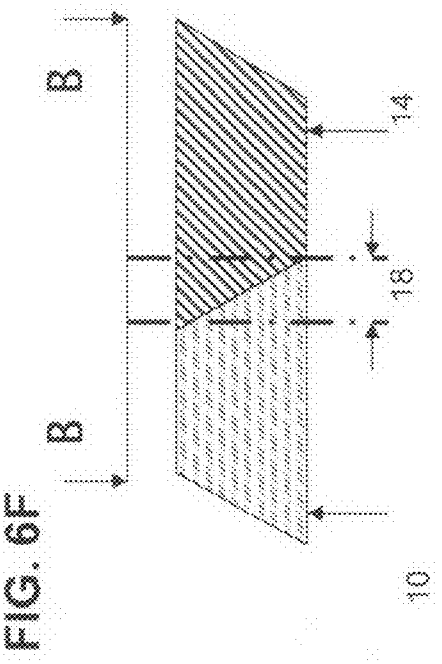
FIG. 6F is a cross-sectional view, along line B-B of FIG. 6D.
Figure 6D:
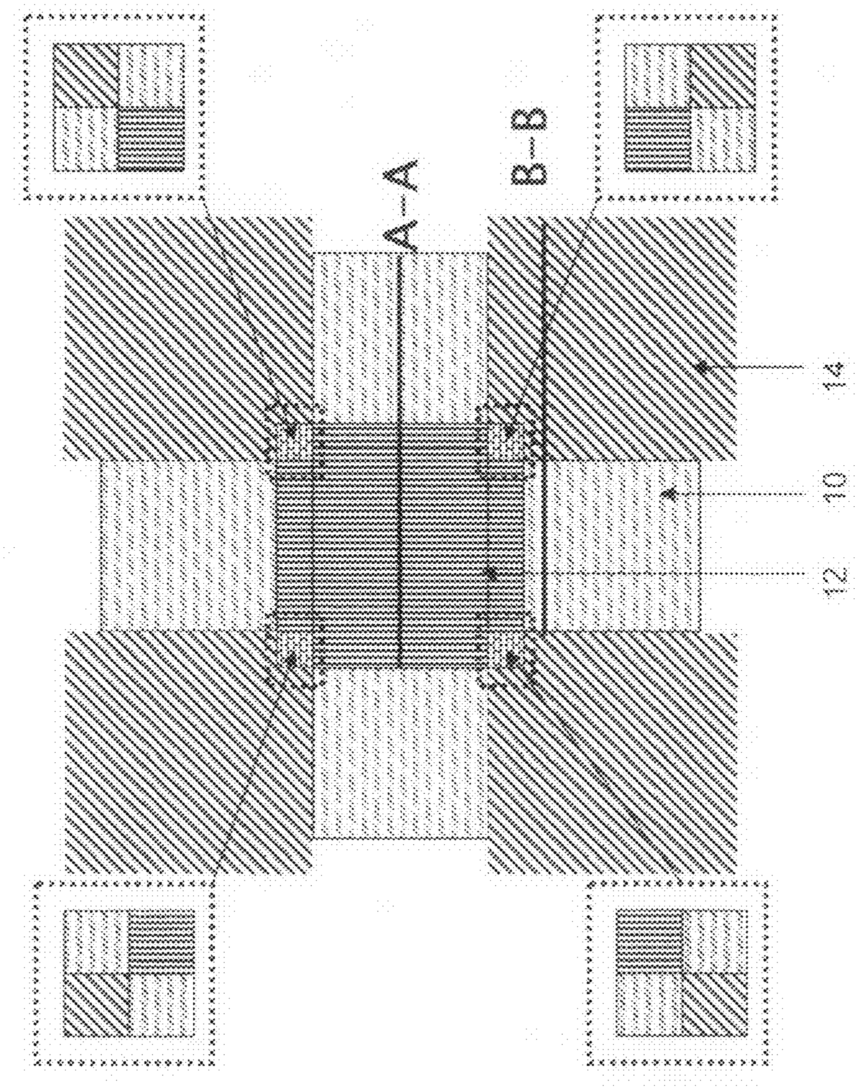
FIG. 6D is a top down view of a single layer modified Bayer pattern color filter array with angled sidewalls with the red and blue portions of the pattern occupying the majority areas, and the blue portion occupying the center position.
Figure 6H:
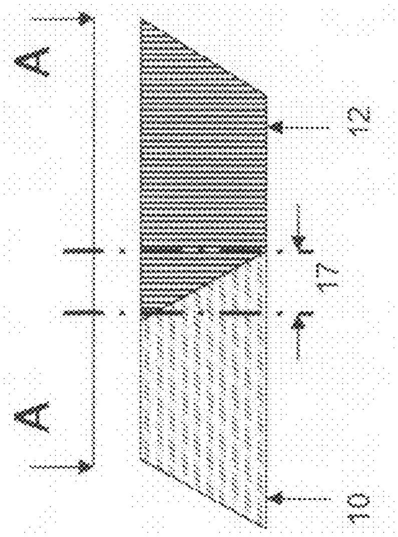
FIG. 6H is a cross-sectional view, along line A-A of FIG. 6G.
Figure 6I:
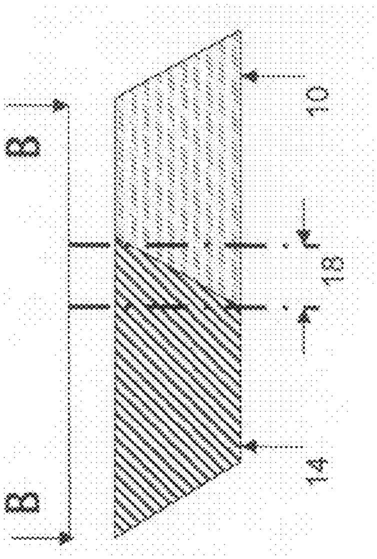
FIG. 6I is a cross-sectional view, along line B-B of FIG. 6G.
Figure 6G:
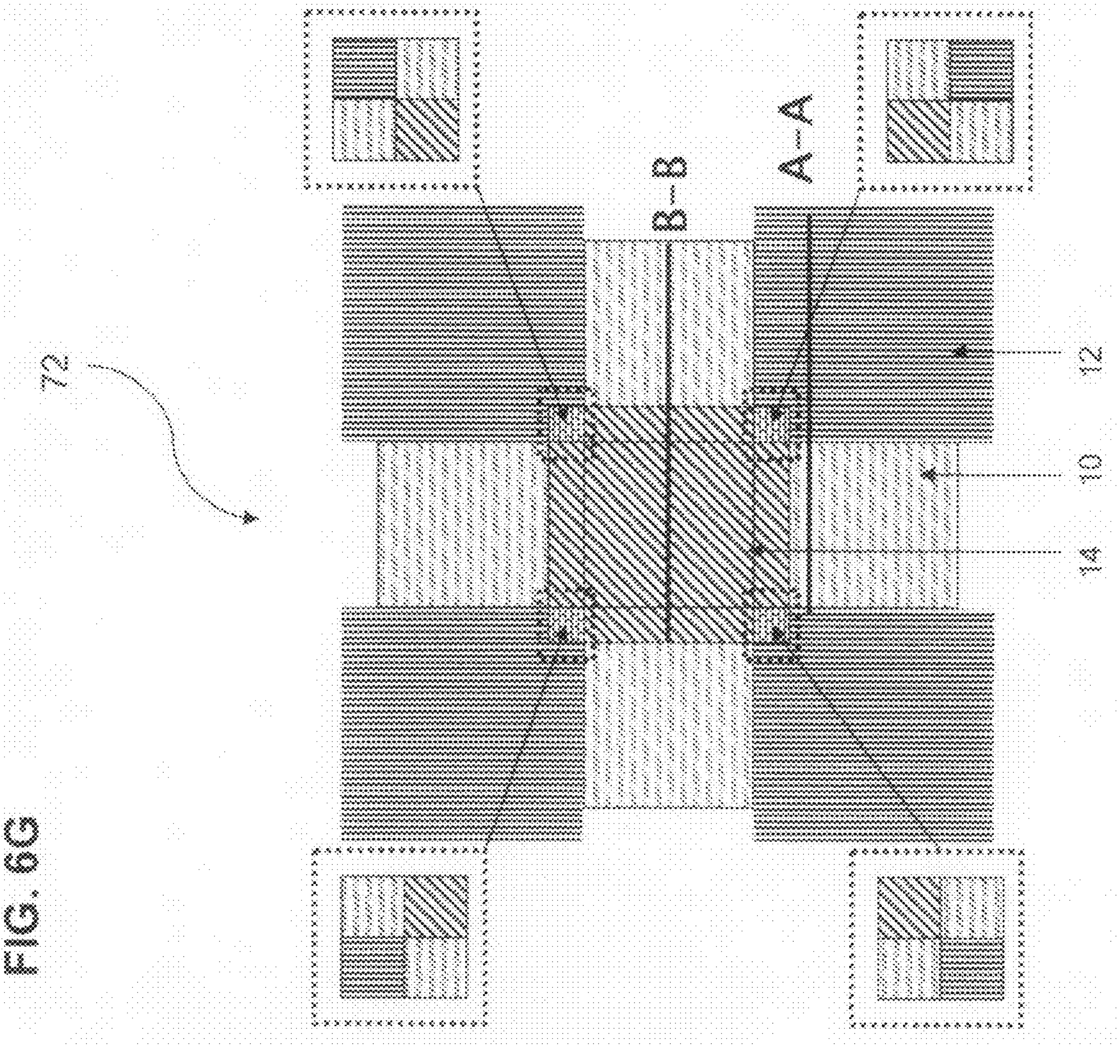
FIG. 6G is a top down view of a single layer modified Bayer pattern color filter array with angled sidewalls with the red and blue portions of the pattern occupying the majority areas, and the red portion occupying the center position.

Referring now to variations of the single-layer third embodiment, FIGS. 6D, 6E, 6F, and 6G, 6H, 6I, are top down and cross-sectional views of respective color filter arrays 70, 72 similar to color filter array 68, except blue 12 and red 14 color filters occupy the majority areas. In the color filter array 70 (FIGS. 6D, 6E, 6F) the blue color filter 12 occupies the center position in the overhead view (FIG. 6D). In color filter array 72 (FIGS. 6G, 6H, 6I) the red color filter 14 occupies the center position of the overhead view (FIG. 6G). Otherwise, the color filter arrays 70, 72 are identical.

The color filter array 68 (FIGS. 6A, 6B, 6C) is constructed as follows. First, a conventional Bayer-patterned color filter array 15 (FIG. 1) is constructed by any means known in the art, to include the etching and exposure techniques as set forth above for color filter array layers 50 (FIGS. 3, 3A, 3B), 52 (FIGS. 3C, 3D, 3E, 3F), 53 (FIGS. 3G, 3H, 3I, 3J), and 54 (FIGS. 3K, 3L, 3M, 3N). Next, everything except either the blue-green fill regions 40 (FIG. 6) or red-green fill regions 42 (FIG. 6) is masked to enable etching of either the blue-green fill regions 40 (FIG. 6) or red-green fill regions 42 (FIG. 6). Assuming the blue-green fill regions 40 (FIG. 6) are etched first, a substantially rectangular blue-green fill region 40 (FIG. 6) is etched some distance toward the bottom of the color filter array 68, or through the color filter array 68. The dimensions of this etch step form the dimensions of the green-blue border region 17 (FIGS. 6B, 6E, 6H). Once this etch step has been completed, in the case of a blue-green fill region 40 (FIG. 6), the blue-green fill region 40 (FIG. 6) is filled with blue color filter material 12. A second etch mask is placed such that an etch can begin at the surface of the color filter array and have a gradually increasing etch depth that creates a pattern in the blue color filter material 12 similar to that shown in the green-blue border region 17 (FIGS. 6B, 6E, 6H). Upon completion of this etch step, the etched portion of the green-blue border region 17 (FIGS. 6B, 6E, 6H) can be filled with green color filter material 10 to create a pattern similar to the green-blue border region 17 (FIGS. 6B, 6E, 6H). Once forming the blue-green fill regions 40 (FIG. 6) is completed, the red-green fill regions 42 (FIG. 6) can be etched and filled using a similar method. Although presented as unmodified in the color filter array 68 (FIG. 6), the corner regions 44 (FIG. 6) can be modified using masking, etch, and fill techniques to create any desired color filter pattern. The color filter arrays 70 (FIGS. 6D, 6E, 6F), 72 (FIGS. 6G, 6H, 61) are constructed using methods as set forth above for color filter array layer 68 (FIGS. 6A, 6B, 6C) except the green color filter material 10 is used following the first etch step and subsequent etching allows for placement of either blue color filter material 12 (in the case of a blue-green fill region 40), or red color filter material 14 (in the case of a red-green fill region 42) to form the pattern of the green-blue 17 (FIGS. 6B, 6E, 6H) and green-red 18 (FIGS. 6C, 6F, 6I) border regions, respectively.

Figure 7A:
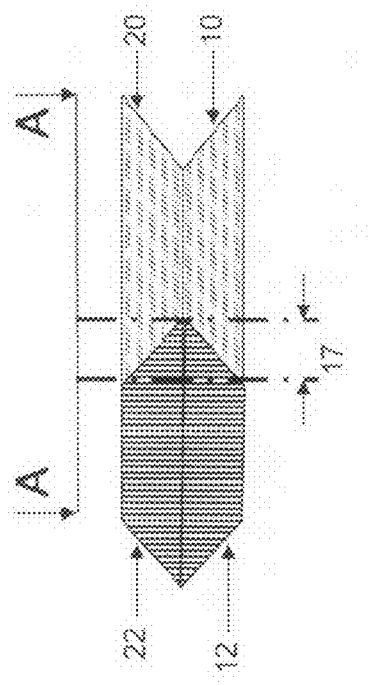
FIG. 7A is a cross-sectional view, along line A-A of FIG. 7.
Figure 7B:
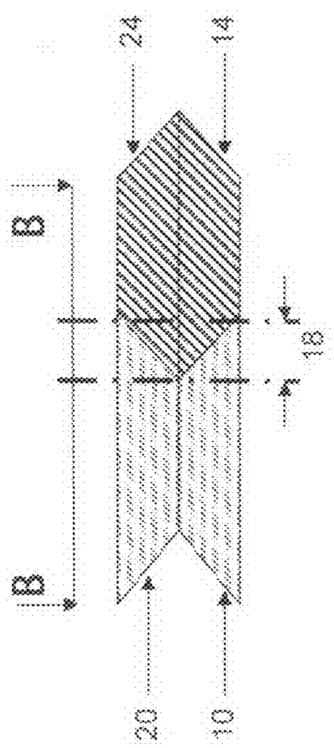
FIG. 7B is a cross-sectional view, along line B-B of FIG. 7.
Figure 7:
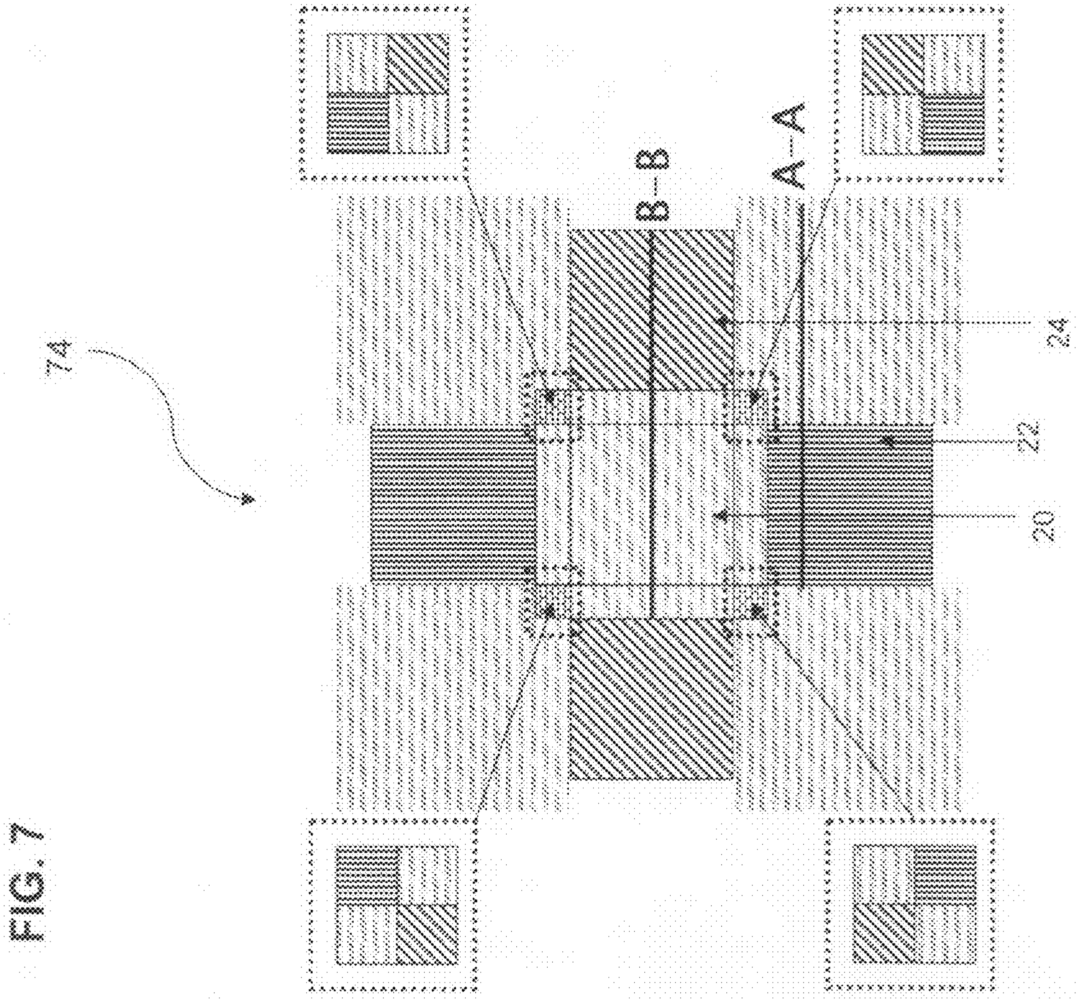
FIG. 7 is a top down view of a dual layer modified Bayer pattern color filter array with angled sidewalls with the green portions of the pattern occupying the majority areas of the top layer.
Figure 7G:
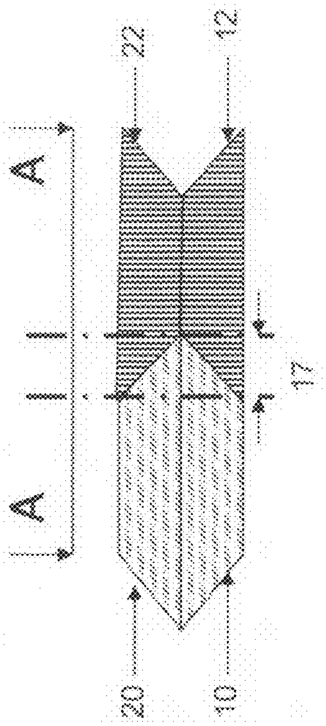
FIG. 7G is a cross-sectional view, along line A-A of FIG. 7F.
Figure 7H:
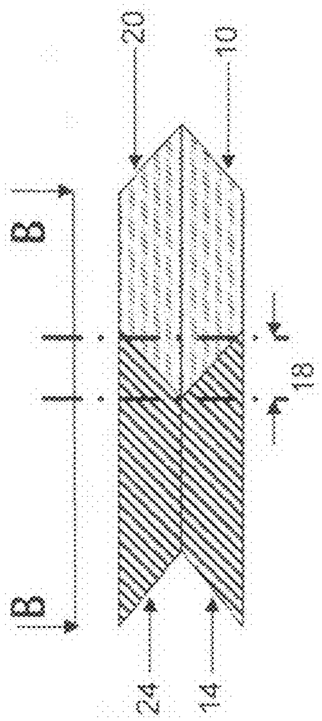
FIG. 7H is a cross-sectional view, along line B-B of FIG. 7F.
Figure 7F:
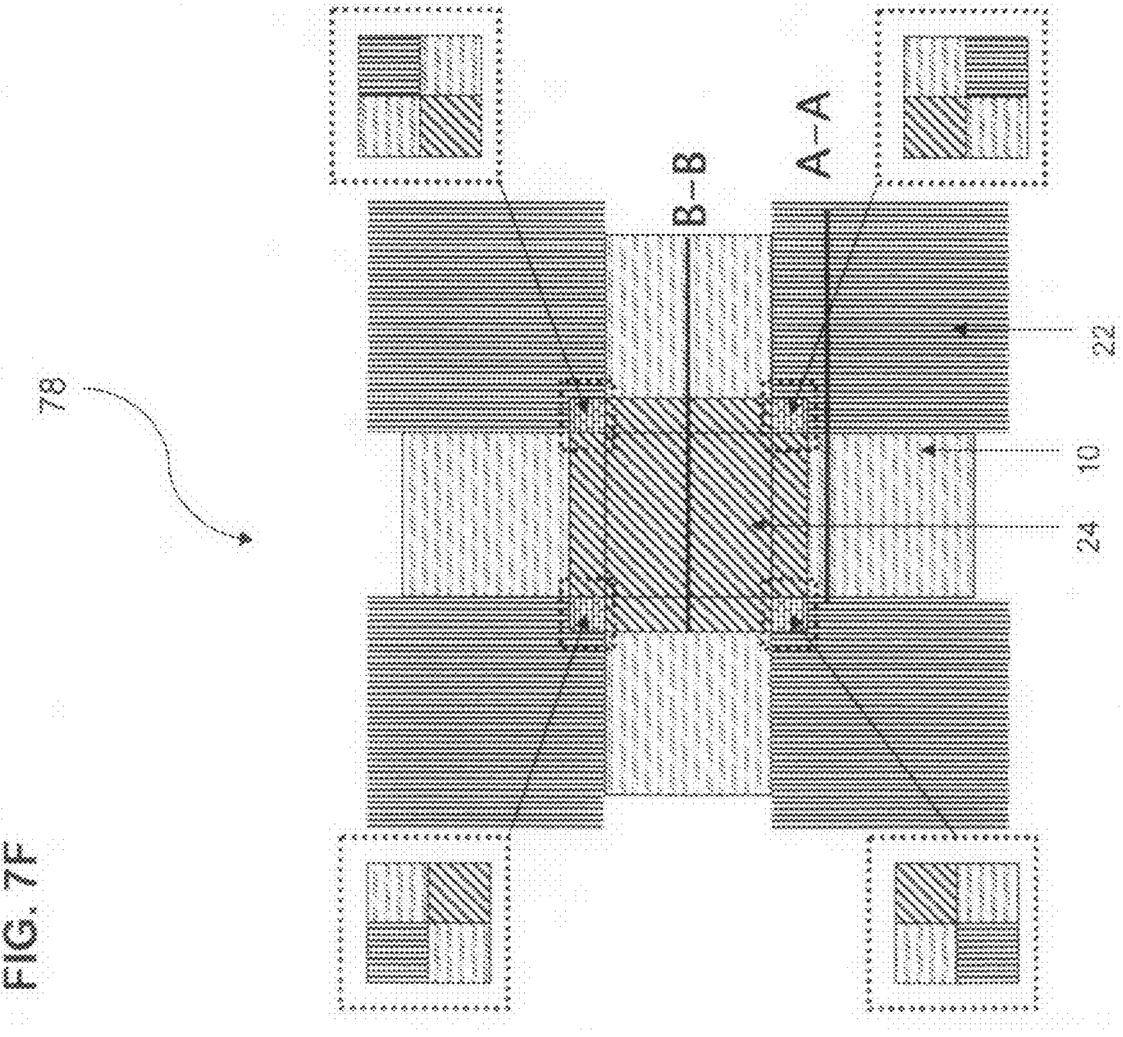
FIG. 7F is a top down view of a dual layer modified Bayer pattern color filter array with angled sidewalls with the red and blue portions of the pattern occupying the majority areas of the top layer, and the red portion occupying the center position.

Referring now to a dual-layer fourth embodiment, FIGS. 7, 7A, 7B are a top down and cross-sectional view of a color filter array 74. The color filter array 74 is similar to color filter array 68 (FIGS. 6A, 6B, 6C) except it has an additional layer identical to the color filter array layer 70 (FIGS. 6D, 6E, 6F), 72 (FIGS. 6G, 6H, 6I) that is substantially centered under like color filters. For example, and not intended to be limiting, as shown for color filter array 74, the green color filter 20 is substantially centered above a green color filter 10 of the bottom layer (FIG. 7A). The same arrangement occurs for the blue 12 and red 14 color filters, except that the tapered side-walls produce an increasing surface area for the top layer color filter 22, 24, and the tapered sidewalls produce a decreasing surface area for the bottom layer color filter 12, 14 (FIGS. 7A, 7B), as measured from the top surface of the color filter array 74. This configuration creates the green-blue border regions 17 (FIG. 7A) and green-red border regions 18 (FIG. 7B).

Referring now to variations of the dual-layer fourth embodiment, FIGS. 7C, 7D, 7E, and 7F, 7G, 7H are overhead and cross-sectional views of color filter arrays 76, 78 similar to color filter array 74 (FIG. 7), except blue 12 and red 14 color filters occupy the majority areas. In the color filter array 76 (FIGS. 7C, 7D, 7E), the blue color filter 12 occupies the center position of the overhead view. In the color filter array 78 (FIGS. 7F, 7G, 7H), the red color filter 14 occupies the center position of the overhead view. Like color filter array 76 (FIG. 7), the green color filter 20 is above an inverted green color filter 10 of the bottom layer that is substantially centered under the top layer green color filter 20 (FIGS. 7D, 7G, 7E, 7H). This same arrangement occurs for the blue 12 and red 14 color filters, except that the top layer color filter 22, 24 is inverted, and the bottom layer color filter 12, 14 is upright (FIGS. 7D, 7G, 7E, 7H). This configuration creates the green-blue border regions 17 (FIGS. 7D, 7G) and green-red border regions 18 (FIGS. 7E, 7H).

The color filter arrays 74 (FIGS. 7, 7A, 7B), 76 (FIGS. 7C, 7D, 7E), 78 (FIGS. 7F, 7G, 7H) are constructed as follows. For color filter array 74 (FIGS. 7, 7A, 7B), a bottom color filter array layer is created as described for color filter array 70 (FIGS. 6D, 6E, 6F). The top color filter array layer can only be formed after the bottom color filter array layer is formed. The top color filter array 68 (FIGS. 6A, 6B, 6C) is formed over the bottom color filter array 70 (FIG. 6D, 6E, 6F). Both color filter arrays 70 (FIGS. 6D, 6E, 6F), 68 (FIGS. 6A, 6B, 6C) can be formed as described above for color filter arrays 68 (FIGS. 6A, 6B, 6C), 70 (FIGS. 6D, 6E, 6F), 72 (FIGS. 6G, 6H, 6I). For color filter array 76 (FIGS. 7C, 7D, 7E), a bottom color filter array 68 (FIGS. 6A, 6B, 6C) is created. Formed over this color filter array 68 (FIGS. 6A, 6B, 6C) is a top color filter array 70 (FIGS. 6D, 6E, 6F). Both color filter arrays 68 (FIGS. 6A, 6B, 6C), 70 (FIGS. 6D, 6E, 6F) can be formed as described above for color filter arrays 68 (FIGS. 6A, 6B, 6C), 70 (FIGS. 6D, 6E, 6F), 72 (FIGS. 6G, 6H, 6I). Color filter array 78 (FIGS. 7F, 7G, 7H) is identical to color filter array 76 (FIGS. 7C, 7D, 7E), except that color filter array 78 (FIGS. 7F, 7G, 7H) has the red color filter 14 in the center position of the overhead view (FIG. 7F). As such, color filter array 78 can be formed as described for the color filter array 76 (FIGS. 7C, 7D, 7E) discussed previously.

Figure 8:
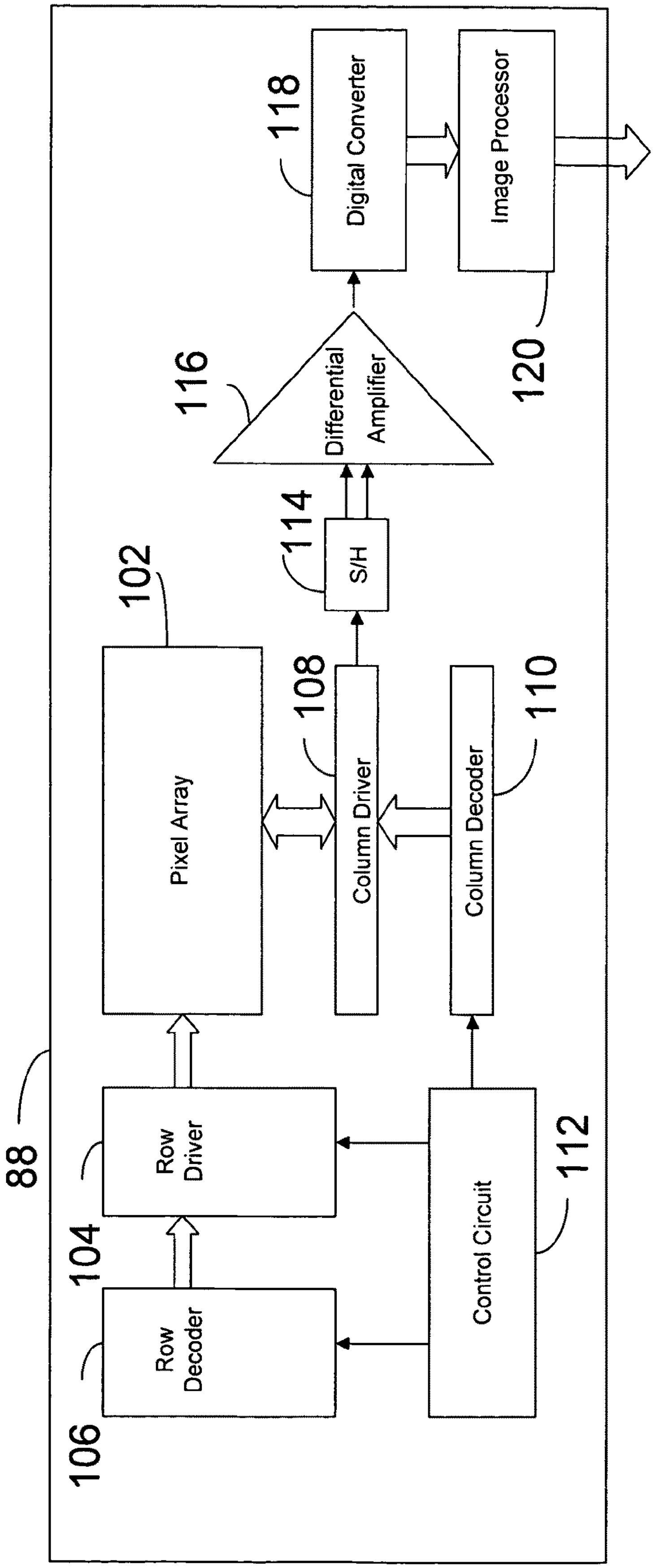
FIG. 8 is a block diagram of an example of an imaging device which may employ the color filter arrays according to various disclosed embodiments.

Referring to FIG. 8, an imager 88, for example, a CMOS imager, for use with the system 80 (FIG. 9) is shown. The imager 88 has a pixel array 102 comprising a plurality of pixels arranged in a predetermined number of columns and rows. Attached to the array 102 is signal processing circuitry. The pixels of each row in array 102 are all turned on at the same time by a row select line, and the pixels of each activated row are selectively output by respective column select lines. Pluralities of row and column select lines are provided for the entire array 102. The row lines are selectively activated by a row driver 104 in response to row address decoder 106. The column select lines are selectively activated by a column driver 108 in response to column address decoder 110. Thus, a row and column address is provided for each pixel.

The imager 88 is operated by the timing and control circuit 112, which controls address decoders 106, 110 for selecting the appropriate row and column lines for pixel readout. The control circuit 112 also controls the row and column driver circuitry 104, 108 such that they apply driving voltages to the drive transistors of the selected row and column select lines. The pixel column signals, which for a CMOS imager pixel typically include a pixel reset signal ($V_{rst}$) and a pixel image signal ($V_{sig}$), are read by a sample and hold circuit 114. $V_{rst}$ is read from a pixel immediately after a charge storage region is reset. $V_{sig}$ represents the amount of charges generated by the pixel's photosensitive element and stored in the charge storage region in response to applied light to the pixel. A differential signal of $V_{rst}$ and $V_{sig}$ is produced by differential amplifier 116 for each pixel. The differential signal is digitized by analog-to-digital converter 118 (ADC). The analog-to-digital converter 118 supplies the digitized pixel signals to an image processor 120, which forms and outputs a digital image.

Figure 9:
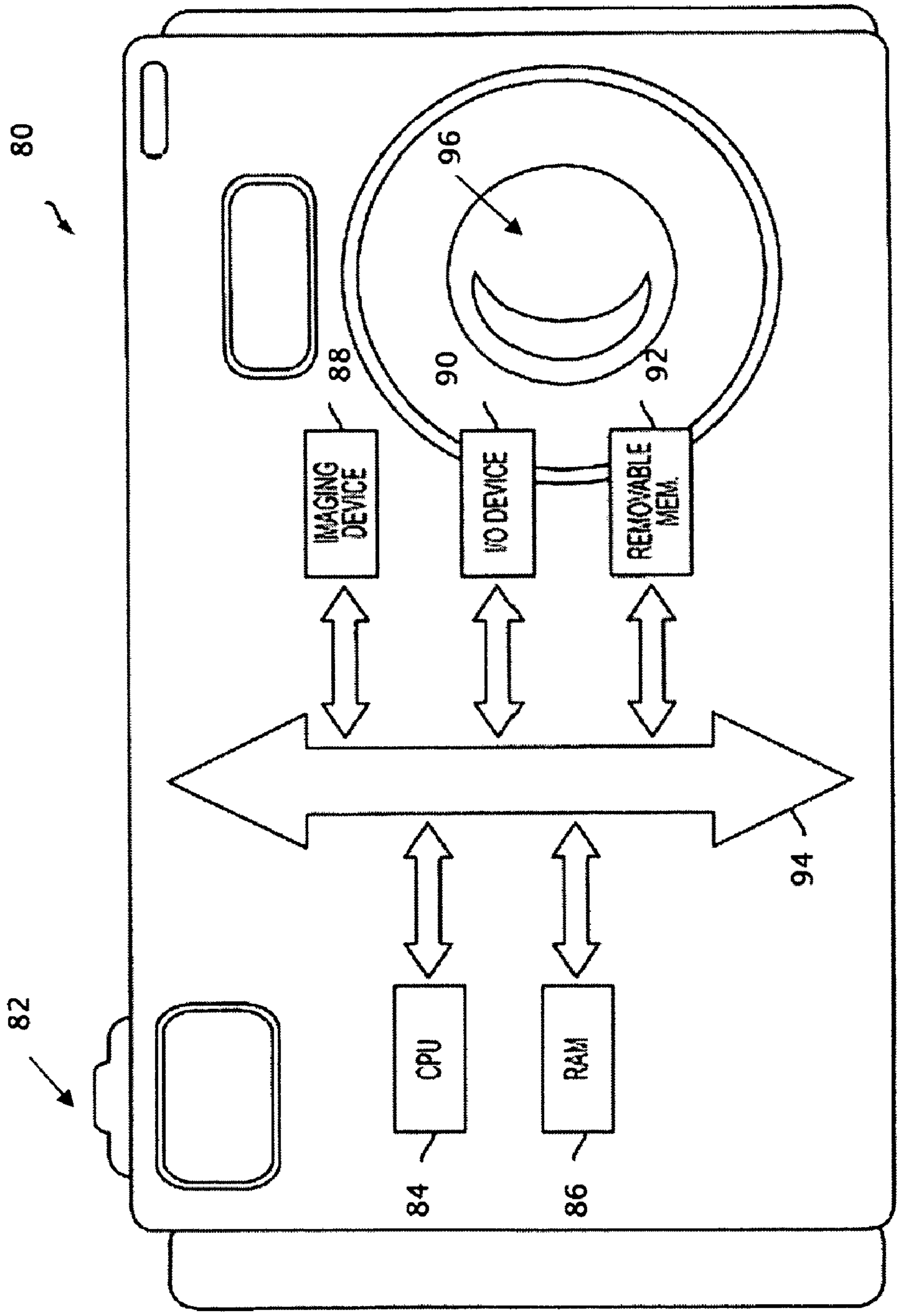
FIG. 9 is a diagram of a system which may employ the color filter arrays according to various disclosed embodiments.

Referring to FIG. 9, a typical system which may use an imager as shown 80, such as, for example, a camera. The system 80 includes an imaging device 88 having a color filter array in accordance with the embodiments described above. The system 80 is an example of a system having digital circuits that could include image sensor devices. Without being limiting, such a system could include a computer system, camera system (as shown), scanner, machine vision, vehicle navigation system, video phone, surveillance system, auto focus system, star tracker system, motion detection system, image stabilization system, and other systems employing an imager.

System 80, for example, a camera system, includes a lens 96 for focusing an image when a shutter release button 82 is pressed. System 80 generally comprises a central processing unit (CPU) 84, such as a microprocessor that controls camera functions and image flow, and communicates with an input/output (I/O) device 90 over a bus 94. The imaging device 88 also communicates with the central processing unit 84 over the bus 94. The processor-based system 80 also includes random access memory (RAM) 86, and can include removable memory 92, such as flash memory, which also communicates with the central processing unit 84 over the bus 94. The imaging device 88 may be combined with the central processing unit 84, with or without memory storage on a single integrated circuit or on a different chip than the central processing unit 84.

It should again be noted that although the embodiments have been described with specific references to color filter arrays 56, 58, 59, 60, 62, 64, 65, 66, 68, 70, 72, 74, 76, 78 intended for light capture, the embodiments have broader applicability and may be used in any imaging apparatus, including those that require image display. For example, without limitation, embodiments may be used in conjunction with Liquid Crystal Display (LCD) technologies. In addition, although an example of use of the optical packages with CMOS image sensors have been given, the embodiments disclosed herein have applicability to other solid state image sensors, including but not limited to CCD systems, as well as display devices.

The above described embodiments allow for reducing optical crosstalk by reducing the contamination of an adjacent photodetector when impacted by either a deflected photon 11 (FIG. 2) or errant photon 13 (FIG. 2). Additionally, the above described embodiments allow for tuning the spectral response of a pixel by : (a) allocating intersect regions between the majority filters, (b) selecting the amount of horizontal overlap that occurs within the border regions 17, 18 (FIGS. 4A, 4B) of the color filters 2, (this can also be described as allocating the color filter surface area between the majority and minority filters), (c) selecting the vertical allocation of the multiple layers of color filters 2, (d) selecting the form of the border regions 17, 18 (FIGS. 4A, 4B), and (e) allocating corner regions 44 (FIG. 6) between the majority filters.

The above description and drawings illustrate embodiments which achieve the objects, features, and advantages described. Although certain advantages and embodiments have been described above, those skilled in the art will recognize that substitutions, additions, deletions, modifications and/or other changes may be made.

What is claimed as new and desired to be protected by Letters Patent of the United States is:

1. An imaging device comprising:

a pixel array for generating an output signal representing a captured image, the pixel array including a plurality of pixel circuits;

a color filter that filters received light, comprising;

at least a first filter element of a first color;

at least a second filter element of a second color, wherein at least edge portions of the first filter element overlap edge portions of the second filter element and the first filter element and the second filter element have angled sidewalls to form an overlap of the portion of the edge of the first filter element with the portion of the edge of the second filter element;

at least a third filter element of the first color; and at least a fourth filter element of the second color, wherein the third filter element is substantially centered under the first filter element, the fourth filter element is substantially centered under the second filter element, and wherein the third filter element and the fourth filter element have angled sidewalls to form an overlap of a portion of the edge of the third filter element with a portion of the fourth filter element.

2. The imaging device of claim 1 wherein color filter array further comprises:

at least a fifth filter element of a third color, wherein the fifth filter element and the first filter element have angled sidewalls to form an overlap of the portion of the edge of the first filter element with a portion of the edge of the fifth filter element; and at least a sixth filter element of a third color, wherein the sixth filter element is substantially centered under the fifth filter element, and the fifth filter element and the sixth filter element filter a color different than the colors filtered by the first filter element and the second filter element, and the sixth filter element has angled sidewalls to form an overlap of a portion of the edge of the third filter element.

3. The imaging device of claim 2, wherein the surface area of the second filter element and the fifth filter element are substantially equal, and the surface area of the fourth filter element and the sixth filter element are substantially equal.

4. The imaging device of claim 3, wherein the first filter element and the third filter element are a green color filter element, the second filter element and the fourth filter element are a blue color filter element, and the fifth filter element and the sixth filter element are a red color filter element.

5. The imaging device of claim 4, wherein a surface area of two of the first filter elements is greater than a combined surface area of one second filter element and one fifth filter element.

6. The imaging device of claim 4, wherein a surface area of two of the first filter elements is less than a combined surface area of one second filter element and one fifth filter element.

7. An imaging device comprising:

a pixel array for generating an output signal representing a captured image, the pixel array including a plurality of pixel circuits;

a color filter array for filtering light received by the pixel array and comprising:

a first color filter array, the first color filter array comprising a plurality of different colored filter elements;

a second color filter array formed below the first color filter array, the second color filter array comprising a plurality of the different colored filter elements;

the first and second color filter arrays being arranged such that every filter element of the first array overlaps with a same colored filter element of the second array, and some colored filter element edges of the first array overlap with a different colored filter element edge of the second array.

8. The imaging device of claim 7 wherein, the first color filter array's plurality of different colored elements comprising at least one first element, at least one second element, and at least one third element;

the second color filter array's plurality of different colored elements comprising at least one fourth element, at least one fifth element, and at least one sixth element, and wherein the at least one fourth, fifth, and sixth elements are substantially centered below the first, second, and third elements, respectively.

9. The imaging device of claim 7 wherein the color filter array further comprises:

a third color filter array formed below the second color filter array, the third color filter array comprising a plurality of the different colored filter elements, the second and third color filter array being arranged such that every filter element of the second array overlaps with a same colored filter element of the third array and some colored filter element edges of the second array overlap with a different colored filter element edge of the third array.

10. The imaging device of claim 8, the color filter array further comprising:

a third color filter array formed below the second color filter array, the third color filter array comprising a plurality of the different colored filter elements, the second and third color filter array being arranged such that every filter element of the second array overlaps with a same colored filter element of the third array and some colored filter element edges of the second array overlap with a different colored filter element edge of the third array, wherein the third color filter array's plurality of different colored elements comprising at least one seventh element, at least one eighth element, and at least one ninth element, and wherein the at least one seventh, eighth, and ninth elements are substantially centered below the at least one fourth, fifth, and sixth elements.

11. The imaging device of claim 10 wherein the surface area of the at least one eighth element and the at least one ninth element are substantially equal, the surface area of the at least one fifth element and the at least one sixth element are substantially equal, and the surface area of the at least one second element and the at least one third element are substantially equal.

12. The imaging device of claim 11 wherein the first, fourth, and seventh elements are green color filter elements, the second, fifth, and eighth elements are blue color filter elements, and the third, sixth, and ninth elements are red color filter elements.

13. The imaging device of claim 12 wherein a surface area of two of the at least one seventh elements is greater than a combined surface area of an at least one eighth element and an at least one ninth element.

14. The imaging device of claim 12 wherein a surface area of two of the at least one seventh elements is less than a combined surface area of an at least one eighth element and an at least one ninth element.

15. The imaging device of claim 14 wherein the color filter array further comprises at least one intersect region between a corner of the at least one eighth element and the at least one ninth element, and wherein the at least one intersect region comprises some horizontal allocation of the intersect region, between and including, all blue color filter material and all red color filter material.

16. The imaging device of claim 15 wherein the color filter array further comprises at least one intersect region between a corner of the at least one second element and the at least one third element, and wherein the at least one intersect region comprises some horizontal allocation of the intersect region, between and including, all blue color filter material and all red color filter material.

17. The imaging device of claim 16 wherein the horizontal allocation of the at least one intersect region of the eighth and ninth elements is different from the intersect region allocation of the at least one intersect region of the second and third elements.

18. A method of forming a color filter array comprising the acts of:

forming at least a first filter element of a first color; and forming at least a second filter element of a second color, wherein at least edge portions of the first filter element overlap edge portions of the second filter element and the first filter element and the second filter element are formed to have angled sidewalls that form an overlap of the portion of the edge of the first filter element with the portion of the edge of the second filter element;

forming at least a third filter element of the first color; and forming at least a fourth filter element of the second color, wherein the third filter element is formed substantially centered under the first filter element, the fourth filter element is formed substantially centered under the second filter element, and wherein the third filter element and the fourth filter element are formed having angled sidewalls that form an overlap of a portion of the edge of the third filter element with a portion of the fourth filter element.

19. The method of claim 18 further comprising:

forming at least a fifth filter element of a third color, wherein the fifth filter element and the first filter element are formed having angled sidewalls that form an overlap of the portion of the edge of the first filter element with a portion of the edge of the fifth filter element; and forming at least a sixth filter element of a third color, wherein the sixth filter element is formed substantially centered under the fifth filter element, and the fifth filter element and the sixth filter element filter a color different than the colors filtered by the first filter element and the second filter element, and the sixth filter element is formed having angled sidewalls to form an overlap of a portion of the edge of the third filter element.

20. The method of claim 19, wherein the second filter element and the fifth filter element are formed to have substantially equal surface areas, and the fourth filter element and the sixth filter element are formed to have substantially equal surface areas.

21. The method of claim 20, wherein the first filter element and the third filter element are formed from green color filter material, the second filter element and the fourth filter element are formed from blue color filter material, and the fifth filter element and the sixth filter element are formed from red color filter material.

22. The method of claim 21, wherein a surface area of two of the first filter elements is greater than a combined surface area of one second filter element and one fifth filter element.

23. The method of claim 21, wherein a surface area of two of the first filter elements is less than a combined surface area of one second filter element and one fifth filter element.

24. A method of forming a color filter array, the method comprising:

forming a first color filter array, the first color filter array comprising a plurality of different colored filter elements;

forming a second color filter array below the first color filter array, the second color filter array comprising a plurality of the different colored filter elements;

forming the first and second color filter arrays such that every filter element of the first array overlaps with a same colored filter element of the second array and some colored filter element edges of the first array overlap with a different colored filter element edge of the second array.

25. The method of claim 24 wherein, the first color filter array's plurality of different colored elements are formed to have at least one first element, at least one second element, and at least one third element;

the second color filter array's plurality of different colored elements are formed to have at least one fourth element, at least one fifth element, and at least one sixth element, and wherein the at least one fourth, fifth, and sixth elements are formed substantially centered below the first, second, and third elements, respectively.

26. The method of claim 24 further comprising:

forming a third color filter array formed below the second color filter array, wherein forming the third color filter array comprises forming a plurality of the different colored filter elements, the second and third color filter array being formed such that every filter element of the second array overlaps with a same colored filter element of the third array and some colored filter element edges of the second array overlap with a different colored filter element edge the third array.

27. The method of claim 25 further comprising:

forming a third color filter array formed below the second color filter array, the third color filter array comprising a plurality of the different colored filter elements, the second and third color filter array being formed such that every filter element of the second array overlaps with a same colored filter element of the third array and some colored filter element edges of the second array overlap with a different colored filter element edge of the third array, wherein the third color filter array's plurality of different colored elements are formed to have at least one seventh element, at least one eighth element, and at least one ninth element, and wherein the at least one seventh, eighth, and ninth elements are formed such that they are substantially centered below the at least one fourth, fifth, and sixth elements.

28. The method of claim 27 wherein the at least one eighth element and the at least one ninth element are formed to have substantially equal surface areas, the at least one fifth element and the at least one sixth element are formed to have substantially equal surface areas, and the at least one second element and the at least one third element are formed to have substantially equal surface areas.

29. The method of claim 28 wherein the first, fourth, and seventh elements are formed from green color filter material, the second, fifth, and eighth elements are formed from blue color filter material, and the third, sixth, and ninth elements are formed from red color filter material.

30. The method of claim 29 wherein a surface area of two of the at least one seventh elements is greater than a combined surface area of an at least one eighth element and an at least one ninth element.

31. The method of claim 29 wherein a surface area of two of the at least one seventh elements is less than a combined surface area of an at least one eighth element and an at least one ninth element.

32. The method of claim 31 further comprising forming at least one intersect region between a corner of the at least one eighth element and the at least one ninth element, wherein the at least one intersect region is formed to have a horizontal allocation of the intersect region between and including, all blue color filter material and all red color filter material.

33. The method of claim 32 further comprising forming at least one intersect region between a corner of the at least one second element and the at least one third element, wherein the at least one intersect region is formed to have a horizontal allocation of the intersect region, between and including, all blue color filter material and all red color filter material.

34. The method of claim 33 wherein the horizontal allocation of the at least one intersect region of the eighth and ninth elements is formed to be different from the intersect region allocation of the at least one intersect region of the second and third elements.

35. A color filter array comprising:

a first filter element of a first color wherein the first filter element is part of a first color filter array layer;

a second filter element of a second color, the second filter element is part of a second color filter array layer formed below the first color filter array layer, and wherein at least edge portions of the first filter element overlap edge portions of the second filter element;

a third filter element of a first color substantially centered below the first filter element, wherein the third filter element is part of a third color filter array layer formed below the second color filter array layer, and wherein edge portions of the second filter element overlap edge portions of the third filter element;

a fourth and sixth filter element of a second color and a fifth filter element of a first color wherein the fifth filter element is on the second layer and substantially centered between the first and third filter elements, and the fourth and sixth filter elements are substantially centered above and below the second filter element, on the first and third layers, respectively; and a seventh, eighth, and ninth filter element of a third color wherein the eighth filter element is on the second layer and adjacent the fifth filter element such that edge portions of the first and third filter elements overlap edge portions of the eighth filter element and wherein the eighth filter element is substantially centered above and below, respectively, the ninth and seventh filter elements.

36. The color filter array of claim 35 provided within a camera system comprising:

a pixel array of an imaging device comprising an integrated circuit for generating output signals representing a captured image, the pixel array including a plurality of pixel circuits each comprising a photodetector formed in a substrate; and a lens for forming an image on the pixel array.

37. The color filter array of claim 35, wherein the surface area of the second filter element, the eighth filter element, and the third filter element are substantially equal.

38. The color filter array of claim 37, wherein the first filter element of a first color is a green color filter element, the second filter element of a second color is a blue color filter element, and the eighth filter element of a third color is a red color filter element.

39. The color filter array of claim 38, wherein a surface area of two of the first filter elements of a first color is greater than a combined surface area of one of the fourth filter elements of a second color, and one of the seventh filter elements of a third color.

40. The color filter array of claim 38, wherein a surface area of two of the first filter elements of a first color is less than a combined surface area of one of the second filter elements of a second color, and one of the seventh filter elements of a third color.

41. The color filter array of claim 40 wherein the color filter array further comprises at least one intersect region between a corner of the seventh filter element and the fourth filter element, and wherein the at least one intersect region comprises some horizontal allocation of the intersect region, between and including, all blue color filter material and all red color filter material.

42. The color filter array of claim 41 wherein the color filter array further comprises at least one intersect region between a corner of the ninth filter element and the sixth filter element, and wherein the at least one intersect region comprises some horizontal allocation of the intersect region, between and including, all blue color filter material and all red color filter material.

43. The color filter array of claim 42 wherein the horizontal allocation of the at least one intersect region of the seventh and fourth filter elements is different from the intersect region allocation of the at least one intersect region of the ninth and sixth filter elements.

* * * * *